US008407555B2

(12) United States Patent
Shen et al.

(10) Patent No.: US 8,407,555 B2
(45) Date of Patent: *Mar. 26, 2013

(54) LDPC CODES ROBUST TO NON-STATIONARY NARROWBAND INGRESS NOISE

(75) Inventors: Ba-Zhong Shen, Irvine, CA (US); Avi Kliger, Ramat Gan (IL)

(73) Assignee: Broadcom Corporation, Irvine, CA (US)

(*) Notice: Subject to any disclaimer, the term of this patent is extended or adjusted under 35 U.S.C. 154(b) by 443 days.

This patent is subject to a terminal disclaimer.

(21) Appl. No.: 12/748,547

(22) Filed: Mar. 29, 2010

(65) Prior Publication Data
US 2010/0251064 A1    Sep. 30, 2010

Related U.S. Application Data

(60) Provisional application No. 61/164,814, filed on Mar. 30, 2009, provisional application No. 61/167,354, filed on Apr. 7, 2009.

(51) Int. Cl.
*H03M 13/00* (2006.01)
*H03M 13/03* (2006.01)

(52) U.S. Cl. ........ 714/752; 714/756; 714/758; 714/781; 714/786; 714/803; 714/804

(58) Field of Classification Search .................. 714/752, 714/756, 758, 781, 786, 803, 804
See application file for complete search history.

(56) References Cited

U.S. PATENT DOCUMENTS

| 6,957,375 B2 * | 10/2005 | Richardson | 714/752 |
| 6,961,888 B2 * | 11/2005 | Jin et al. | 714/752 |
| 7,120,856 B2 * | 10/2006 | Zhang et al. | 714/801 |
| 7,178,082 B2 * | 2/2007 | Yu et al. | 714/752 |
| 7,581,157 B2 * | 8/2009 | Oh et al. | 714/781 |
| 8,185,807 B2 * | 5/2012 | Oh et al. | 714/781 |
| 8,201,059 B2 * | 6/2012 | Oh et al. | 714/781 |
| 2006/0013181 A1 | 1/2006 | Stolpman | |
| 2008/0222486 A1 | 9/2008 | Richardson | |
| 2009/0199068 A1 * | 8/2009 | Oh et al. | 714/752 |
| 2012/0185746 A1 * | 7/2012 | Oh et al. | 714/752 |

FOREIGN PATENT DOCUMENTS

EP    1511177 A2    3/2005

OTHER PUBLICATIONS

Liu et al., An LDPC Decoder Chip Based on Self-Routing Network for IEEE 802.16e Applications, Mar. 2008, IEEE, vol. 43, No. 3, pp. 684-694.*

(Continued)

*Primary Examiner* — John J Tabone, Jr.
(74) *Attorney, Agent, or Firm* — Garlick & Markison; Shayne X. Short

(57) ABSTRACT

LDPC codes robust to non-stationary narrowband ingress noise. Particularly designed LDPC codes are adapted to address deleterious noise-effects incurred within LDPC coded signals that propagate via a communication channel (such as from a transmitting communication device to a receiving communication device). Such LDPC matrices employed for encoding and/or decoding such LDPC coded signals are composed of sub-matrices (e.g., all-zero values sub-matrices and/or CSI (Cyclic Shifted Identity) sub-matrices). The sub-matrices are generally uniform in size and square in shape. Based on certain operational conditions, such as communication channel noise, various operations within a communication device are adaptively modified (e.g., signaling, modulation, demodulation, symbol mapping, metric generation, decoding, etc.). Various types of signaling may be employed for such LDPC coded signals including orthogonal frequency division multiplexing (OFDM) signaling, which may include employing symbols of different size therein (e.g., symbols with x and y bits, respectively, with x and y being integers).

20 Claims, 33 Drawing Sheets

OTHER PUBLICATIONS

R. Gallager, Low-Density Parity-Check Codes, Cambridge, MA: MIT Press, 1963, 90 pages.

R. G. Gallager, "Low density parity check codes," IRE Trans. Info. Theory, vol. IT-8, Jan. 1962, pp. 21-28.

M. G. Luby, M. Mitzenmacher, M. A. Shokrollahi, D. A. Spielman, and V. Stemann, "Practical Loss-Resilient Codes," Proc. 29th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47, No. 2, Feb. 2001, pp. 599-618.

Marc P. C. Fossorier, "Quasi-Cyclic Low-Density Parity-Check Codes From Circulant Permutation Matrices," IEEE Trans. Inform. Theory, vol. 50, No. 8, Aug. 2004, pp. 1788-1793.

Stiglmayr, et al.; Mutual-information-based adaptive coding and modulation in bit-interleaved OFDM systems using punctured LDPC codes; European Transactions on Telecommuncations; pp. 801-811; vol. 19, No. 7; Nov. 1, 2008.

Ohtsuki; LDPC Codes in Communications and Broadcasting; IEICE Transactions on Communications;Mar. 1, 2007; pp. 440-453; vol. E90B, No. 3.

Richardson, et al.; Efficient encoding of low-density parity-check codes; IEEE Transactions on Information Theory; 2001; pp. 638-656; vol. 47, Iss 2.

Lestable T., et al.; LDPC Coding Options for Next Generation Wireless Systems:, 14th Wireless World Research Forum Proc; WWRF '05; Jul. 1, 2005; pp. 1-10; San Diego, CA, US.

European Patent Office; EP Application No. 10003470.1; Sep. 19, 2012; 11 pages.

\* cited by examiner narrowband ingress noise:
SNR with three interferer (NBI=25 dBc, SNR=25 dB)

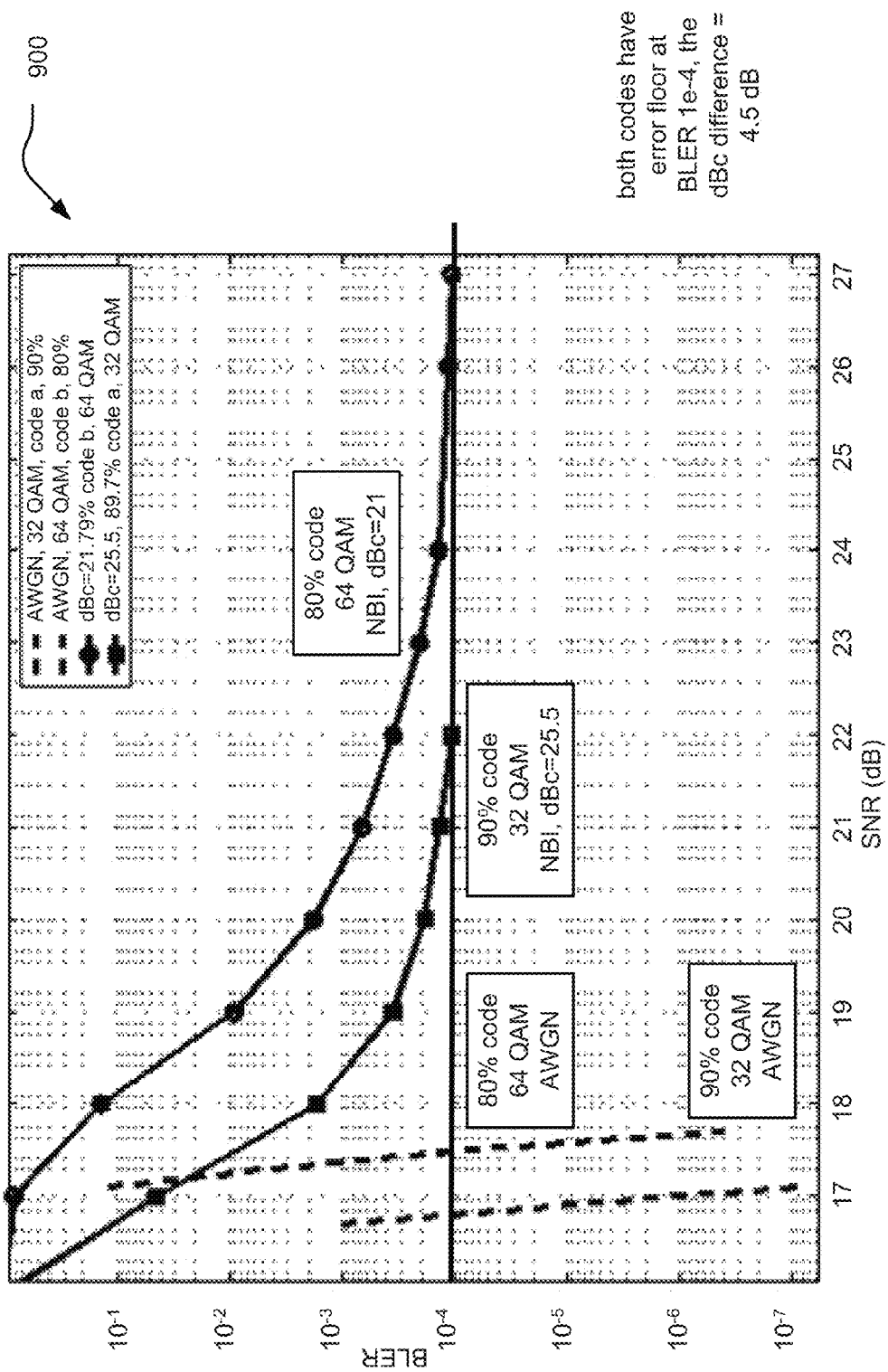
Fig. 9   80% code vs. 90% code

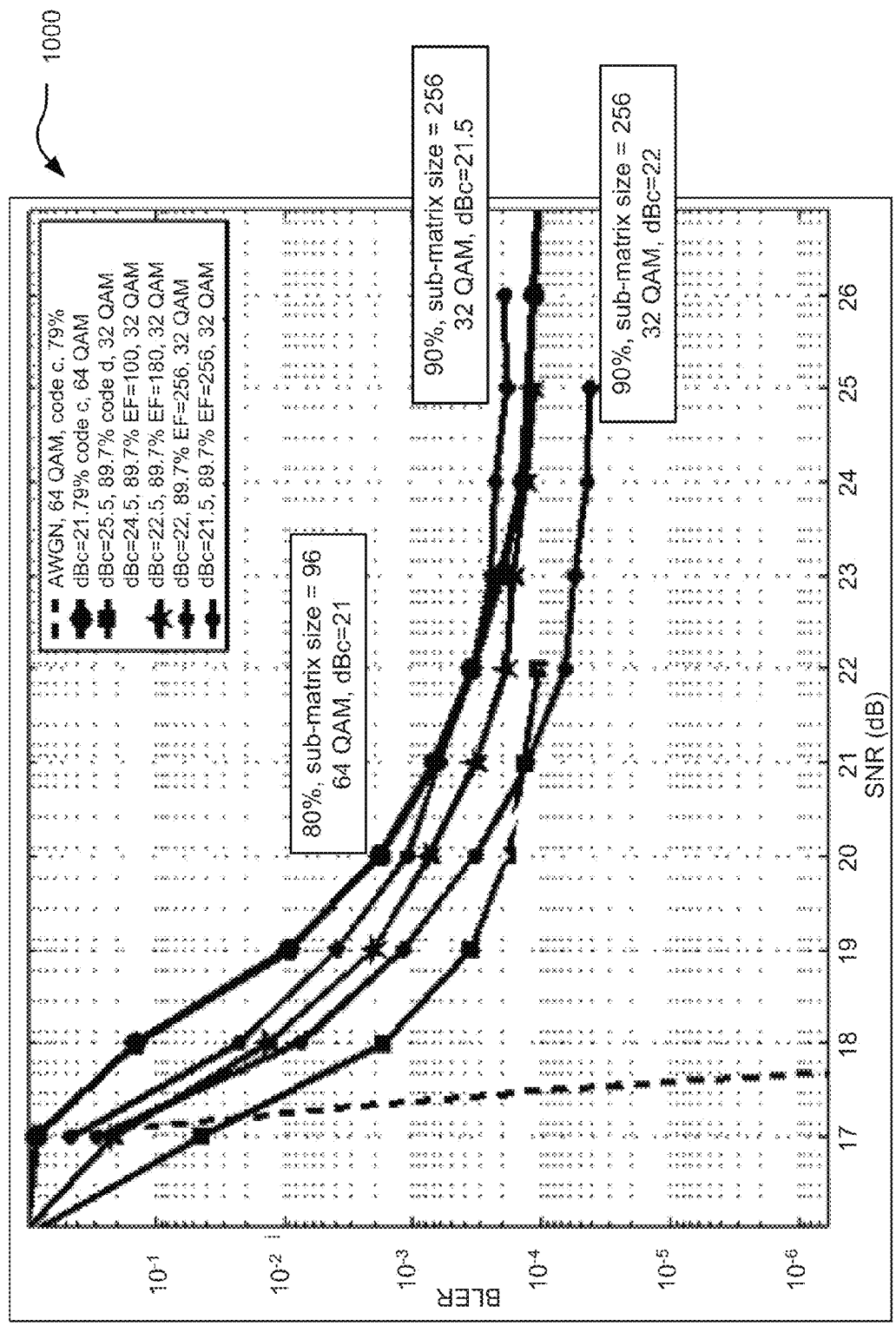
Fig. 10 code with larger sub-matrix size or effective factor (EF) (90% code)

$$H = [H_1 \mid H_2]$$

$H_1 =$ [matrix shown]

| | | | | | | | | | | | | | | | | | | | | | | | | | | | |
|---|---|---|---|---|---|---|---|---|---|---|---|---|---|---|---|---|---|---|---|---|---|---|---|---|---|---|---|
| - | 19 | - | - | 59 | 20 | - | 34 | - | 16 | - | 58 | 17 | 35 | - | - | - | - | - | - | - | - | - | 31 | - | 56 | 16 | - |
| - | 50 | - | - | 16 | 29 | - | - | - | 53 | 29 | 10 | 59 | - | 56 | 60 | 59 | 79 | - | - | - | - | 50 | 30 | 25 | 66 | - | - |
| 13 | 57 | - | 35 | - | - | - | 75 | - | - | - | 32 | 61 | 76 | - | 11 | 14 | - | 76 | - | - | 39 | 36 | 51 | - | - | 36 | 17 |
| - | - | 62 | - | 32 | - | 18 | - | - | - | - | 52 | - | 55 | - | 32 | 32 | - | - | - | - | 47 | - | 52 | 45 | 26 | 79 | 21 | 16 | 74 |
| - | - | - | - | 74 | 67 | - | - | - | - | 77 | 53 | - | - | - | 49 | - | 38 | - | - | 78 | 68 | 10 | 58 | 74 | 22 | 42 | - | - | 09 | - | 29 | 26 |
| 14 | 30 | - | - | - | 11 | 33 | - | - | - | - | - | - | - | - | - | - | - | - | 72 | - | 22 | 09 | - | 02 | 76 | - | 07 |
| - | - | - | 31 | 63 | 66 | 25 | 47 | 79 | - | 57 | - | - | - | 36 | - | - | 51 | - | 23 | 69 | - | 54 | 25 | 42 | - | 63 | 58 |
| - | 28 | - | 13 | - | - | - | - | 17 | 05 | - | - | - | 35 | 28 | - | - | - | - | - | - | - | 19 | - | 67 | 03 | 51 | - | 30 |
| 10 | - | 48 | 15 | - | - | 40 | 49 | - | - | - | - | 30 | 53 | - | - | - | 62 | - | 74 | - | 38 | 61 | - | - | - | 63 | - |
| 65 | 14 | - | 06 | - | - | 12 | 37 | - | 59 | - | 68 | 73 | 57 | - | - | - | 42 | 25 | 46 | - | - | - | 12 | - | - | - | - |
| 42 | - | 46 | 12 | - | - | - | - | - | - | - | 10 | 61 | - | - | - | 62 | - | 73 | - | - | - | - | - | 10 | - | - | 78 | 30 |
| 43 | 41 | 23 | - | 58 | 32 | 47 | 21 | 40 | - | - | 25 | 25 | - | - | - | 43 | - | - | - | - | - | 12 | - | 14 | 47 | - | 29 | 65 |
| 29 | - | 01 | 54 | - | - | - | - | - | - | 39 | - | 69 | - | - | 66 | 12 | 39 | - | - | 47 | - | - | 48 | - | - | - | 25 |
| - | - | - | - | - | - | 19 | 19 | - | 38 | - | 06 | - | 49 | - | - | 75 | - | - | 46 | - | 58 | 13 | - | 30 | 20 | - | 70 |
| - | 26 | 47 | 64 | 14 | - | - | - | - | - | - | 29 | - | - | - | - | - | - | - | 75 | - | 62 | 24 | - | 02 | - | 34 | - | 44 | 64 |

74% LDPC code, block size 4640, sub-matrix size = 80 × 80
base matrix size 15 × 58 [15 sub-matrix rows, 58 sub-matrix columns]

Fig. 11 (shows $H_1$)

Fig. 12 (shows H₂)

$$H = [H_1 \; H_2]$$

$H_2 =$

```
 -  51  -  21  -  20  -  31 70 23  -  -  06 16  -  -  -  05  -  -  -  64 23 67  -  -  51 53  -  -
79 51 39 36 28 47 54  -  - 18  -  -  -  -  -  -  -  -  -  -  -  -  -  -  -  -  -  -  -  -
 -  -  -  - 63  -  -  - 18  -  -  -  -  -  - 65 38  -  -  - 64 47  -  -  -  -  -  -  -  -
 - 68  -  -  -  -  -  -  -  - 42  -  - 07 74  -  - 53  -  - 13 05  -  -  -  -  -  -  -  -
58 20  - 44 13  -  -  -  - 04  -  -  -  -  -  - 21 60 07  - 44 74 30  - 38 43 65  -  - 40 16 12 23 75
 -  - 26 17 29  -  -  -  - 30 45  -  -  -  -  - 61  -  -  - 47  -  -  -  -  -  -  -  -  -  -  - 05  - 64
 - 39 06  -  -  - 16  -  - 62  -  - 45 03 05  -  - 58  -  - 35 45 35 77 76 34  - 41 36  -  -  -  -  -  -
 - 52  -  -  -  -  -  - 20 54  -  - 17 10  -  - 56 31  - 13  - 61  -  -  -  -  -  - 09 59  - 13  - 60
 -  -  -  - 04  -  - 02 61  - 44 01 42  - 43 67 33 52 17 37 10 06  -  - 29  -  -  - 54 34 34 50  -
 -  - 58  -  -  - 44  -  - 69  - 22 77  - 13 46 37  - 27  -  - 03  -  - 01 25  -  -  - 37 78 65 36
10  - 18  -  -  - 50  -  -  - 18 54  -  -  -  - 68  - 27 13 53  - 41 74  - 06 25  -  - 02 04  -  - 41 50
 -  -  - 07  -  -  -  -  -  -  - 25  -  - 73  -  -  -  -  - 30 20  -  -  - 02 14  -  - 02 13 31 36 11
49 25 10 45 22 75 03  -  -  - 37 28 46  -  - 27 41  -  - 13 04  -  - 67 14  -  - 35  -  -  -  -  -  -
01  -  - 21 79 55 68 76  -  - 32  -  -  -  -  -  -  -  - 52 15  - 78 19 36  -  - 05  -  -  -  -  -  -
70 44  - 52 09  - 21  -  - 32  - 23 64  - 73 65  -  -  - 66 73 46
```

74% LDPC code, block size 4640, sub-matrix size = 80 × 80
base matrix size 15 × 58 [15 sub-matrix rows, 58 sub-matrix columns]

$H = [H_{1a} \; H_{1b} \mid H_2]$ information bit portion "regular"
(robust to ingress noise)

$$H_1 = \begin{bmatrix} 72 & 9 & 57 & 97 & 36 & 61 & 90 & 42 & 94 & 97 & 15 & 94 & 75 & 86 & 7 & 43 & 96 & 4 & 13 & 92 & 14 & 79 & 18 \\ 73 & 49 & 28 & 49 & 24 & 80 & 56 & 2 & 87 & 7 & 5 & 55 & 86 & 80 & 49 & 49 & 59 & 59 & 58 & 84 & 34 & 58 & 95 \\ 43 & 98 & 35 & 55 & 89 & 53 & 95 & 39 & 2 & 39 & 66 & 37 & 49 & 16 & 36 & 59 & 40 & 83 & 69 & 6 & 62 & 52 & 55 \\ 93 & 8 & 52 & 80 & 30 & 84 & 48 & 62 & 72 & 28 & 51 & 11 & 83 & 97 & 84 & 18 & 8 & 71 & 73 & 23 & 2 & 36 & 9 \\ 31 & 81 & 67 & 42 & 12 & 43 & 60 & 68 & 69 & 48 & 35 & 78 & 91 & 27 & 62 & 44 & 48 & 51 & 67 & 41 & 79 & 1 & 85 \\ 27 & 1 & 36 & 87 & 47 & 66 & 28 & 30 & 9 & 19 & 40 & 12 & 71 & 94 & 98 & 85 & 55 & 32 & 33 & 27 & 8 & 64 & 63 \\ 71 & 40 & 44 & 5 & 6 & 30 & 64 & 71 & 14 & 59 & 49 & 77 & 72 & 42 & 83 & 69 & 5 & 36 & 59 & 78 & 51 & 63 & 59 \end{bmatrix}$$

1300

Fig. 13 (shows $H_{1a}$)

84.8% LDPC code, block size 4600, sub-matrix size = 100 × 100
base matrix size 7 × 46 [7 sub-matrix rows, 46 sub-matrix columns]

$$H_2 = \begin{bmatrix} 28 & 79 & 69 & 46 & 91 & 12 & 40 & 86 & 53 & 75 & 40 & 5 & 14 & 26 & 24 & 48 & 18 & - & - & - & - & - & - \\ 60 & 9 & 10 & 0 & 53 & 85 & 91 & 29 & 99 & 77 & 18 & 80 & 71 & 50 & 62 & 98 & 36 & 92 & - & - & - & - & - \\ 12 & 77 & 86 & 50 & 67 & 78 & 95 & 93 & 33 & 6 & 36 & 51 & 66 & 88 & 45 & 76 & 90 & 83 & 19 & - & - & - & - \\ 63 & 53 & 85 & 72 & 24 & 64 & 67 & 95 & 82 & 22 & 55 & 47 & 99 & 75 & 75 & 55 & 98 & 81 & 92 & 53 & - & - & - \\ 72 & 96 & 4 & 86 & 14 & 3 & 88 & 97 & 48 & 11 & 82 & 26 & 0 & 60 & 21 & 78 & 96 & 44 & 50 & 60 & 37 & - & - \\ 99 & 43 & 15 & 11 & 97 & 95 & 90 & 58 & 90 & 44 & 13 & 82 & 18 & 70 & 51 & 29 & 0 & 99 & 88 & 4 & 86 & 93 & - \\ 67 & 38 & 73 & 41 & 19 & 23 & 63 & 24 & 66 & 24 & 28 & 70 & 7 & 76 & 43 & 49 & 54 & 22 & 85 & 36 & 2 & 27 & 23 \end{bmatrix}$$

$H = [\,H_{1a}\ H_{1b}\ |\ H_2\,]$ $\underbrace{\phantom{H_{1a}\ H_{1b}}}$ information bit portion "regular" (robust to ingress noise)

↙ 1400

Fig. 14 (shows $H_{1b}$ and $H_2$)

84.8% LDPC code, block size 4600, sub-matrix size = 100 × 100
base matrix size 7 × 46 [7 sub-matrix rows, 46 sub-matrix columns]

$$H = [H_1 \mid H_2]$$

$H_1 = $

```
[ 0  58  -  14  -  60  -   4  -  38  66  -  88  -   -   -   8  -  18  -   1  -  22  20  -  83  -  63  37 ]
[ -  75  -  43  -   5  57  -  22  -   -   7  -  47  -   -  81  -   -   -   -   -   -   -   -   -   -  12  94 ]
[ -   4  80  -  54  -  15  -   -   -  91  65  -  58  -   -  36  -  13  35  -  51  -  61  -  65  -   -  63 ]
[37   -  29  -  82  80  -  72  -  61  -   -   -   -  82  -  26  -   -  60  -  88  -  14  30  -  40  -   - ]
[78   -   -  47  -  57  -   -  42  -   -   -  59  51  -  33  -   -  91  -  93  37  71  -   3  -   -  25  - ]
[ -  20   -   -  58  -   -  63  -  68  -  85  -   -  38  -  12  76  -   -  38  -  90  -  40  -  80  18  - ]
[ -   -   -  47  -   -   -   -   -   5  15  -  72  -   -  70  -  17  -  87  -  55  17  69  -   -   -  46  - ]
[ -  35   -   -   -  42  -   -   -   -   -   -  64  -  19  -  62  48  -  28  -   2  -  91  -   -  19  59  - ]
[ 1   -   -   -  58  -   -  63  -  68  -  85  -   -  15  -  19  -   -   -   -  91  -  66  -  28  80  -   - ]
[86   -  36   -   -   -   -   -   -   -   -  76  14  -  42  -  64  -  80  -  90  94  -   -   -  71  45  -  13]
```

79% LDPC code, block size 4608, sub-matrix size = 96 × 96
base matrix size 10 × 48 [10 sub-matrix rows, 48 sub-matrix columns]

Fig. 15 (shows $H_1$)

Fig. 16 (shows H₂)

$$H = [H_1 \mid H_2]$$

$H_2 =$

```
 -   5   -  63   -  19   -   -   -  92   -  18  34   -  44   -  48   -  46   -  38  24   -
 -  74   -  48   -   -   -  65   9   -  43   -  71   -  93   -  13  23   -  27   -   -   4
55   -  41   -  16   -  74   -  30   -  76   -  20  54   -  82   -   8   -   -   -  25  17
44   -   -   -  21   -  91   -  59  21   -  73   -  23   -  63   -   1   -  24   -  34  38
 -   -  42   -  34  20   -   -   -   0   -  70   -  38   -   0  52   -   -   -  29   -  51   -  67
41  51   -  55   -  53   -  45   -  31  11   -  81   -  74   -  49   -  42   -  76   -   8  30
 -  68   -  84   -  94   2   -  63   -   0   -  88   -  77   -   -   -  11   -  63  13   -  87
 -  93  25   -  47   -  63   -  73   -  51   -  84   -  88   -  54  28   -  92   -  54   -  10   -  56
30   -  70   -   8   -  36  58   -  17   -   -   -  75   -  67   -  53   -  33   -   7  71   -  33
71   -  27  73   -  17   -   -   -  51   -  74   -  84   -  88   -  86  78   -  64   -  44   -  18
```

79% LDPC code, block size 4608, sub-matrix size = 96 × 96
base matrix size 10 × 48 [10 sub-matrix rows, 48 sub-matrix columns]

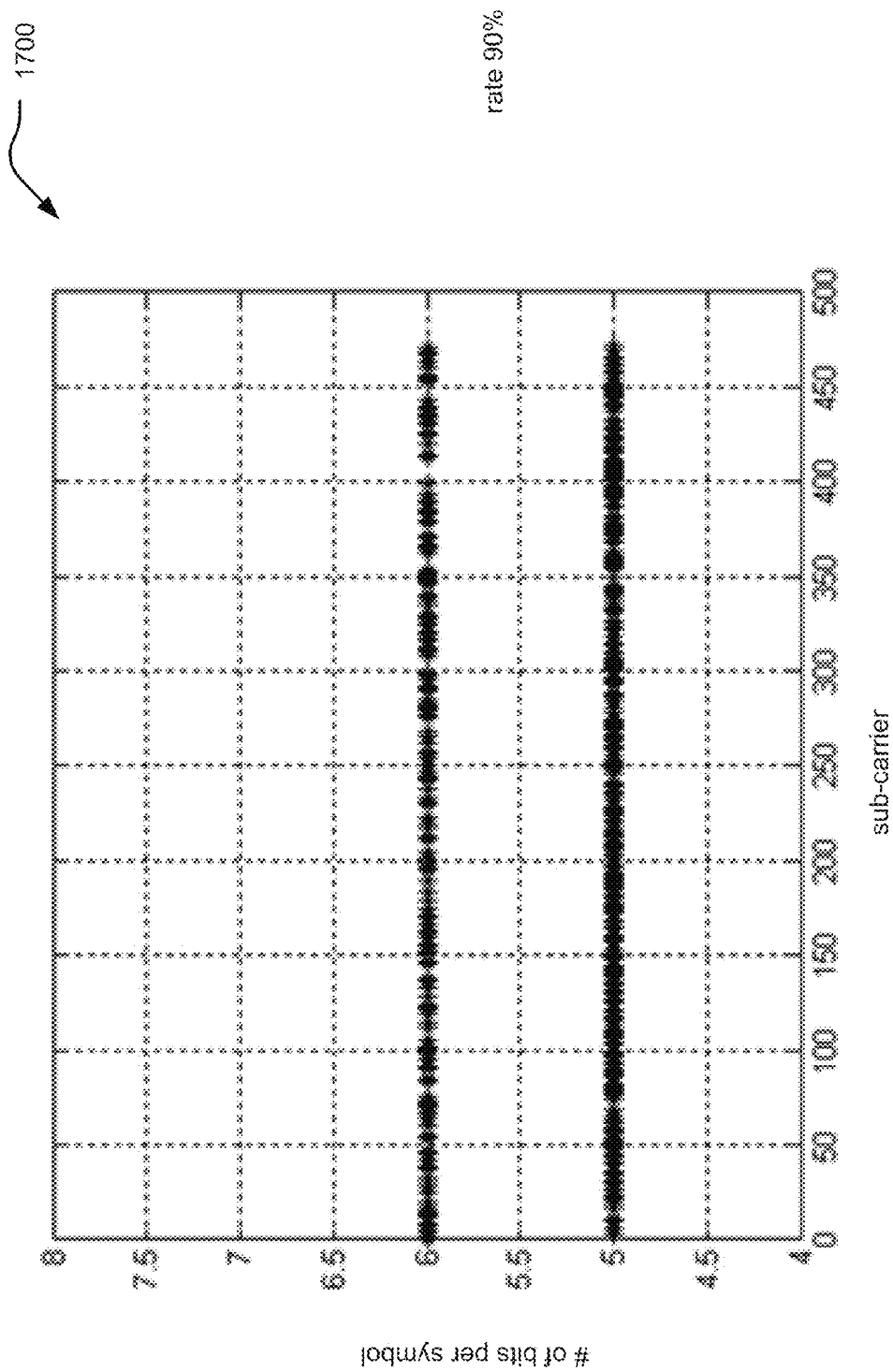
Fig. 17    distribution of constellation sizes among 480 sub-carriers for PHY rate 400 Mb/s Fig. 19 distribution of constellation sizes among 480 sub-carriers for PHY rate 400 Mb/s

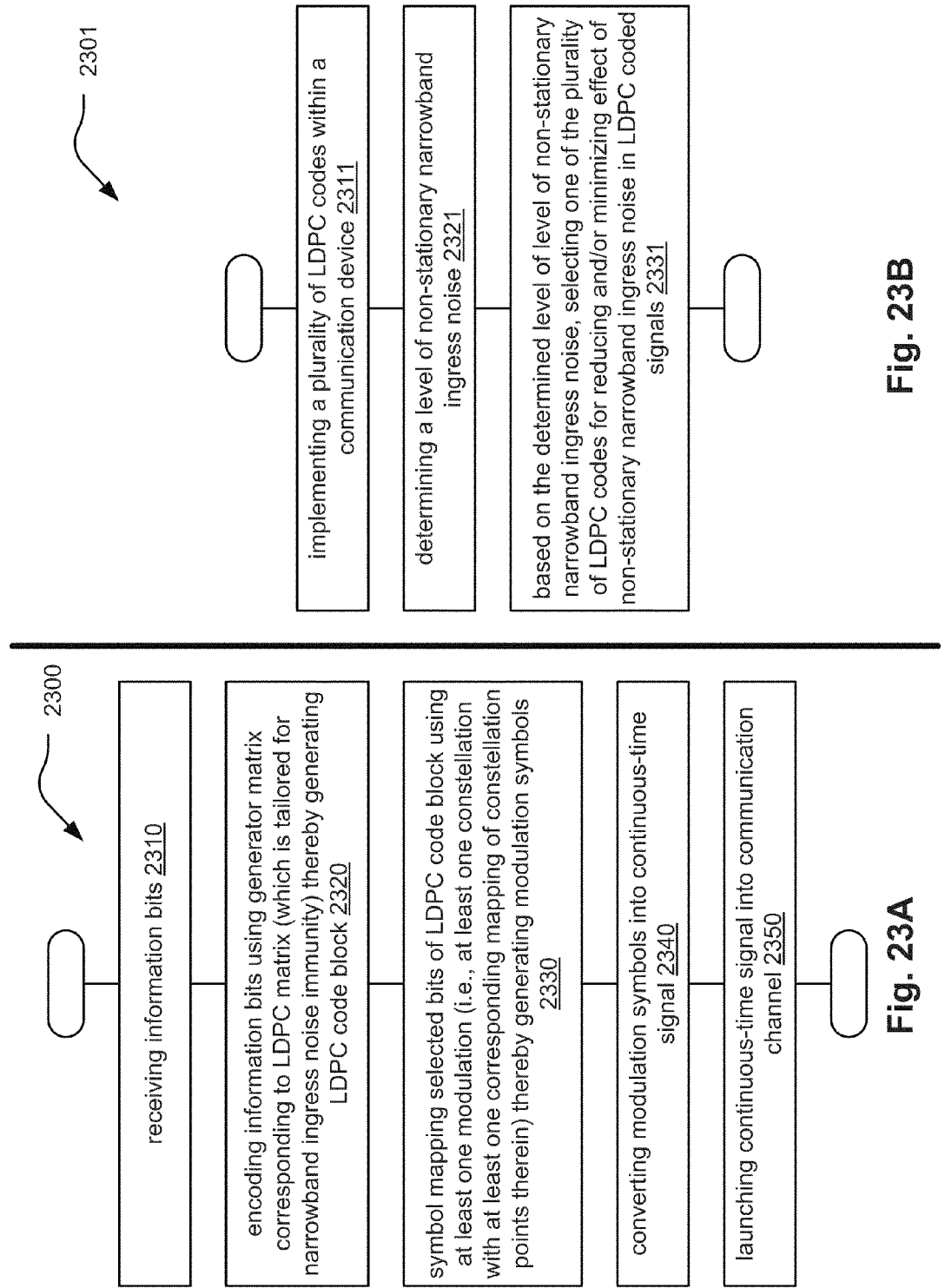

$$H = [H_1 \mid H_2]$$

$$H_1 =$$

| 6 | – | – | – | – | – | – | – | – | 23 | 25 | 79 | 5 | 4 | 79 | 16 | – | – | – | – | – | – | – | – | – | – | 8 | 77 | 72 | 34 | 7 |
|---|---|---|---|---|---|---|---|---|---|---|---|---|---|---|---|---|---|---|---|---|---|---|---|---|---|---|---|---|---|---|
| 31 | 4 | – | – | – | – | – | – | – | – | 47 | 22 | 35 | 59 | 30 | 55 | 18 | – | – | – | – | – | – | – | – | – | – | 1 | 55 | 26 | 52 |
| 68 | 46 | 0 | – | – | – | – | – | – | – | – | 15 | 36 | 54 | 36 | 46 | 65 | 32 | – | – | – | – | – | – | – | – | – | – | 70 | 53 | 64 |
| 53 | 38 | 44 | 50 | – | – | – | – | – | – | – | – | 27 | 44 | 71 | 76 | 9 | 69 | 58 | – | – | – | – | – | – | – | – | – | – | 76 | 46 |
| 52 | 6 | 63 | 47 | 51 | – | – | – | – | – | – | – | – | 67 | 43 | 65 | 74 | 2 | 36 | 29 | – | – | – | – | – | – | – | – | – | – | 61 |
| 48 | 7 | 10 | 41 | 75 | – | – | – | – | – | – | – | – | – | 73 | 37 | 62 | 44 | 23 | 72 | 40 | – | – | – | – | – | – | – | – | – | – |
| 1 | 37 | 66 | 68 | 56 | 1 | – | – | – | – | – | – | – | – | – | – | 50 | 72 | 16 | 18 | 36 | 32 | 24 | – | – | – | – | – | – | – | – |
| – | 44 | 55 | 54 | – | 35 | – | – | – | – | – | – | – | – | – | – | – | 71 | 26 | 72 | 13 | 15 | 17 | 49 | – | – | – | – | – | – | – |
| – | – | 1 | 37 | – | – | 5 | 53 | – | – | – | – | – | – | – | – | – | – | 23 | 73 | 30 | 22 | 72 | 37 | 69 | – | – | – | – | – | – |
| – | – | – | 34 | – | – | 53 | 56 | 53 | – | – | – | – | – | – | – | – | – | – | 20 | 76 | 26 | 43 | 68 | 65 | 75 | 15 | – | – | – | – |
| – | – | – | – | 2 | – | 62 | 42 | 75 | – | – | 41 | – | – | – | – | – | – | – | – | – | 22 | 4 | 3 | 61 | 50 | 33 | 2 | 79 | – | – |
| – | – | – | – | 19 | – | 73 | 70 | 56 | – | 21 | 33 | – | – | – | – | – | – | – | – | – | – | 24 | 6 | 50 | 61 | 29 | 75 | 9 | 28 | – |
| – | – | – | – | – | 28 | 56 | 76 | 61 | 47 | 76 | 65 | 70 | – | – | – | – | – | – | – | – | – | – | – | 45 | 6 | 40 | 64 | 50 | 17 | 45 |
| – | – | – | – | – | – | – | 47 | 55 | 78 | 66 | 40 | 46 | 15 | – | – | – | – | – | – | – | – | – | – | – | – | 6 | 61 | 23 | 17 | 65 | 16 | 19 |
| – | – | – | – | – | – | – | – | 32 | 28 | 2 | 50 | 44 | 40 | 71 | – | – | – | – | – | – | – | – | – | – | – | – | 13 | 30 | 67 | 50 | 32 |
| – | – | – | – | – | – | – | – | – | 52 | 37 | 8 | 65 | 26 | 72 | 75 | – | – | – | – | – | – | – | – | – | – | – | – | – | – | 6 |

74% regular LDPC code, block size 4640, sub-matrix size = 80 × 80
base matrix size 15 × 58 [15 sub-matrix rows, 58 sub-matrix columns]

Fig. 24 (shows $H_1$)

$$H = [H_1 \colon H_2]$$

$$H_2 = \begin{bmatrix}
9 & 1 & - & - & - & - & - & - & - & - & - & 74 & 10 & 36 & 59 & 11 & 56 & 69 & - & - & - & - & - & - & - & 15 & 41 & 34 & 56 \\
25 & 58 & 67 & - & - & - & - & - & - & - & - & - & 22 & 12 & 68 & 37 & 29 & 10 & 53 & - & - & - & - & - & - & - & 32 & 15 & 75 \\
13 & 21 & 54 & 27 & - & - & - & - & - & - & - & - & - & 70 & 72 & 55 & 53 & 65 & 63 & 44 & - & - & - & - & - & - & - & 46 & 31 \\
41 & 31 & 5 & 20 & 77 & - & - & - & - & - & - & - & - & - & 67 & 18 & 30 & 52 & 28 & 52 & 11 & - & - & - & - & - & - & - & 27 \\
42 & 29 & 47 & 36 & 16 & - & - & - & - & - & - & - & - & - & - & 71 & 10 & 8 & 14 & 58 & 52 & 51 & - & - & - & - & - & - & - \\
79 & 49 & 35 & 12 & 47 & 44 & 69 & - & - & - & - & - & - & - & - & - & - & 9 & 0 & 67 & 73 & 78 & 34 & 27 & - & - & - & - & - \\
- & 74 & 10 & 23 & 6 & 22 & 40 & 47 & - & - & - & - & - & - & - & - & - & - & - & 68 & 61 & 33 & 7 & 38 & 63 & 53 & - & - & - \\
- & - & 50 & 50 & 78 & 10 & 48 & 61 & 76 & - & - & - & - & - & - & - & - & - & - & - & 62 & 51 & 37 & 18 & 74 & 37 & 7 & - & - \\
- & - & - & 10 & 42 & 67 & 42 & 79 & 50 & 32 & - & - & - & - & - & - & - & - & - & - & - & 70 & 72 & 54 & 60 & 3 & 72 & 79 & - \\
- & - & - & - & 7 & 57 & 79 & 39 & 20 & 68 & 77 & - & - & - & - & - & - & - & - & - & - & - & 40 & 69 & 76 & 35 & 79 & 1 & 26 \\
- & - & - & - & - & 29 & 32 & 7 & 63 & 39 & 39 & 58 & - & - & - & - & - & - & - & - & - & - & - & 13 & 5 & 50 & 68 & 67 & 46 & 40 \\
- & - & - & - & - & - & 1 & 72 & 42 & 55 & 4 & 36 & 66 & - & - & - & - & - & - & - & - & - & - & - & 57 & 31 & 44 & 17 & 23 & 76 \\
- & - & - & - & - & - & - & 76 & 13 & 65 & 50 & 9 & 69 & 16 & - & - & - & - & - & - & - & - & - & - & - & 33 & 38 & 33 & 54 & 69 & 23 & 35 & 3 \\
- & - & - & - & - & - & - & - & - & 58 & 50 & 22 & 13 & 27 & 53 & 19 & - & - & - & - & - & - & - & - & - & - & 55 & 3 & 44 & 78 & 35 \\
33 & - & - & - & - & - & - & - & - & - & 40 & 65 & 49 & 64 & 5 & 30 & 76 & - & - & - & - & - & - & - & - & - & - & 54 & 10 & 50 & 47 & 41
\end{bmatrix}$$

Fig. 25 (shows $H_2$)

74% regular LDPC code, block size 4640, sub-matrix size = 80 × 80
base matrix size 15 × 58 [15 sub-matrix rows, 58 sub-matrix columns]

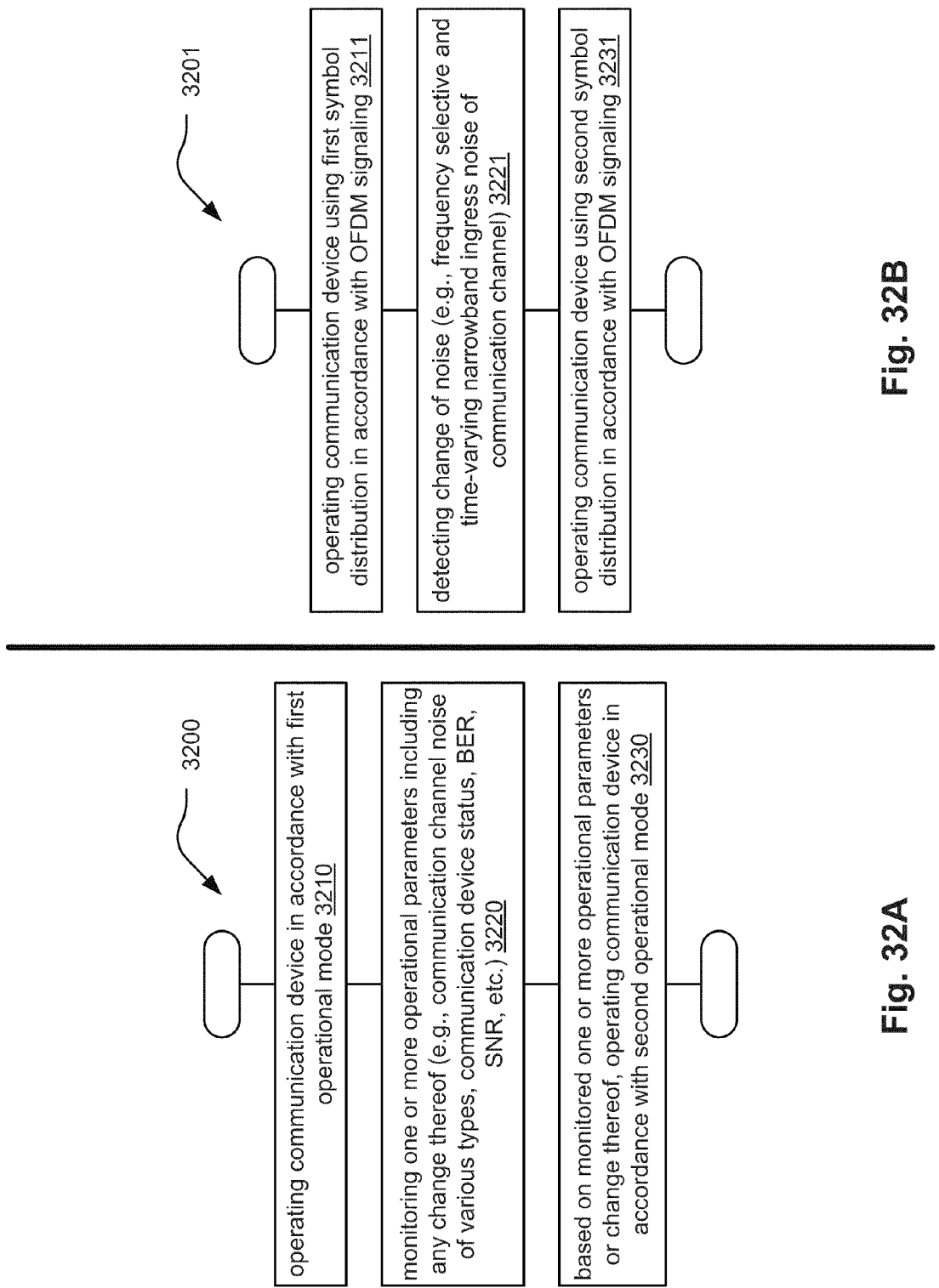

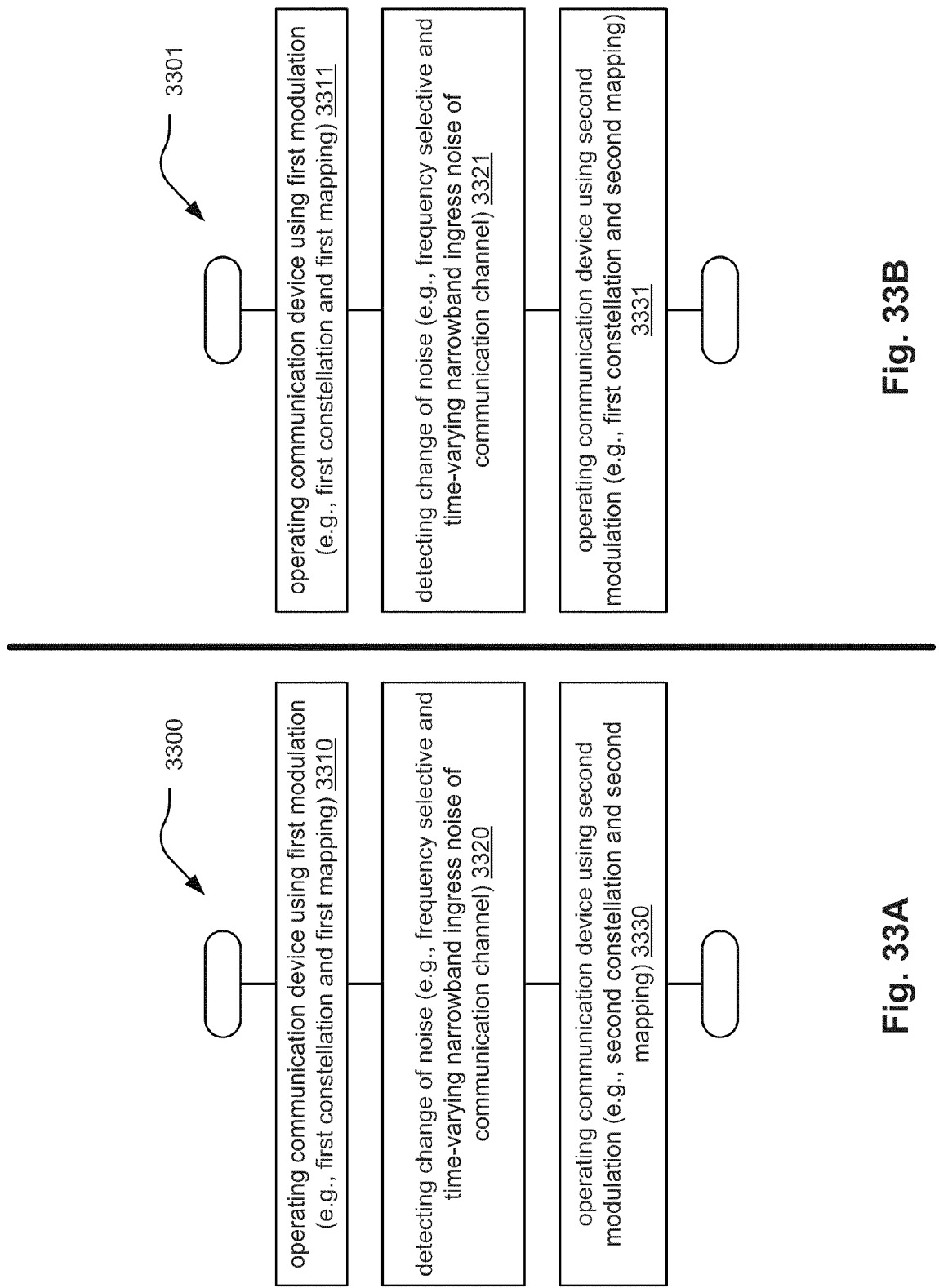

LDPC CODES ROBUST TO NON-STATIONARY NARROWBAND INGRESS NOISE

CROSS REFERENCE TO RELATED PATENTS/PATENT APPLICATIONS

Provisional Priority Claims

The present U.S. Utility Patent Application claims priority pursuant to 35 U.S.C. §119(e) to the following U.S. Provisional Patent Applications which are hereby incorporated herein by reference in their entirety and made part of the present U.S. Utility Patent Application for all purposes:

1. U.S. Provisional Application Ser. No. 61/164,814, entitled "LDPC codes robust to non-stationary narrowband ingress noise,", filed 03-30-2009, pending.

2. U.S. Provisional Application Ser. No. 61/167,354, entitled "LDPC codes robust to non-stationary narrowband ingress noise,", filed 04-07-2009, pending.

BACKGROUND OF THE INVENTION

1. Technical Field of the Invention

The invention relates generally to communication systems that incur and suffer deleteriously from ingress noise; and, more particularly, it relates to communication devices implemented within such communication systems that are robust to such ingress noise.

2. Description of Related Art

Data communication systems have been under continual development for many years. One such type of communication system that has been of significant interest lately is a communication system that employs iterative error correction codes (ECCs). Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code with a length of one million, it nevertheless demonstrates the very promising application of LDPC codes within communication systems.

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3an (10 GBASE-T) emerging standard) as well as communication systems operating within a wireless context (e.g., in the IEEE 802.11 context space including the IEEE 802.11n emerging standard).

For any of these particular communication system application areas, near-capacity achieving error correction codes are very desirable. The latency constraints, which would be involved by using traditional concatenated codes, simply preclude their use in such applications in very high data rate communication system application areas.

Generally speaking, within the context of communication systems that employ LDPC codes, there is a first communication device at one end of a communication channel with encoder capability and second communication device at the other end of the communication channel with decoder capability. In many instances, one or both of these two communication devices includes encoder and decoder capability (e.g., within a bi-directional communication system). LDPC codes can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 9 illustrates an embodiment of a performance comparison between an 80% LDPC code and a 90% LDPC code.

FIG. 10 illustrates an embodiment of a performance comparison between various LDPC codes whose corresponding LDPC matrices have relatively larger sub-matrix sizes or effective factor (EF).

FIG. 11 and FIG. 12 illustrate an embodiment of an LDPC matrix corresponding to a 74% LDPC code (of an LDPC matrix having form, $H=[H_1 H_2]$; FIG. 11 shows $H_1$, and FIG. 12 shows $H_2$.

FIG. 13 and FIG. 14 illustrate an embodiment of an LDPC matrix corresponding to a 84.8% LDPC code (of an LDPC matrix having form, H=[$H_{1a} H_{1b} H_2$]; FIG. 13 shows $H_{1a}$, and FIG. 14 shows $H_{1b}$ and $H_2$.

FIG. 15 and FIG. 16 illustrate an embodiment of an LDPC matrix corresponding to a 79% LDPC code (of an LDPC matrix having form, H=[$H_1 H_2$]; FIG. 15 shows $H_1$, and FIG. 16 shows $H_2$.

FIG. 17 illustrates an embodiment of a distribution of constellation sizes among various sub-carriers within an OFDM operative communication system.

FIG. 23A illustrates an embodiment of a method for employing LDPC coding to generate a coded signal that is robust to narrowband ingress noise.

FIG. 23B illustrates an embodiment of a method for selectively employing one type of LDPC coding to reduce and/or minimize the effect of narrowband ingress noise in LDPC coded signals.

FIG. 24 and FIG. 25 illustrate an embodiment of an LDPC matrix corresponding to a 74% regular LDPC code (of an LDPC matrix having form, H=[$H_1 H_2$]; FIG. 24 shows $H_1$, and FIG. 25 shows $H_2$.

FIG. 32A illustrates an embodiment of a method for operating a communication device.

FIG. 32B, FIG. 33A, and FIG. 33B illustrate various alternative embodiments of methods for operating a communication device.

DETAILED DESCRIPTION OF THE INVENTION

Figure 1:
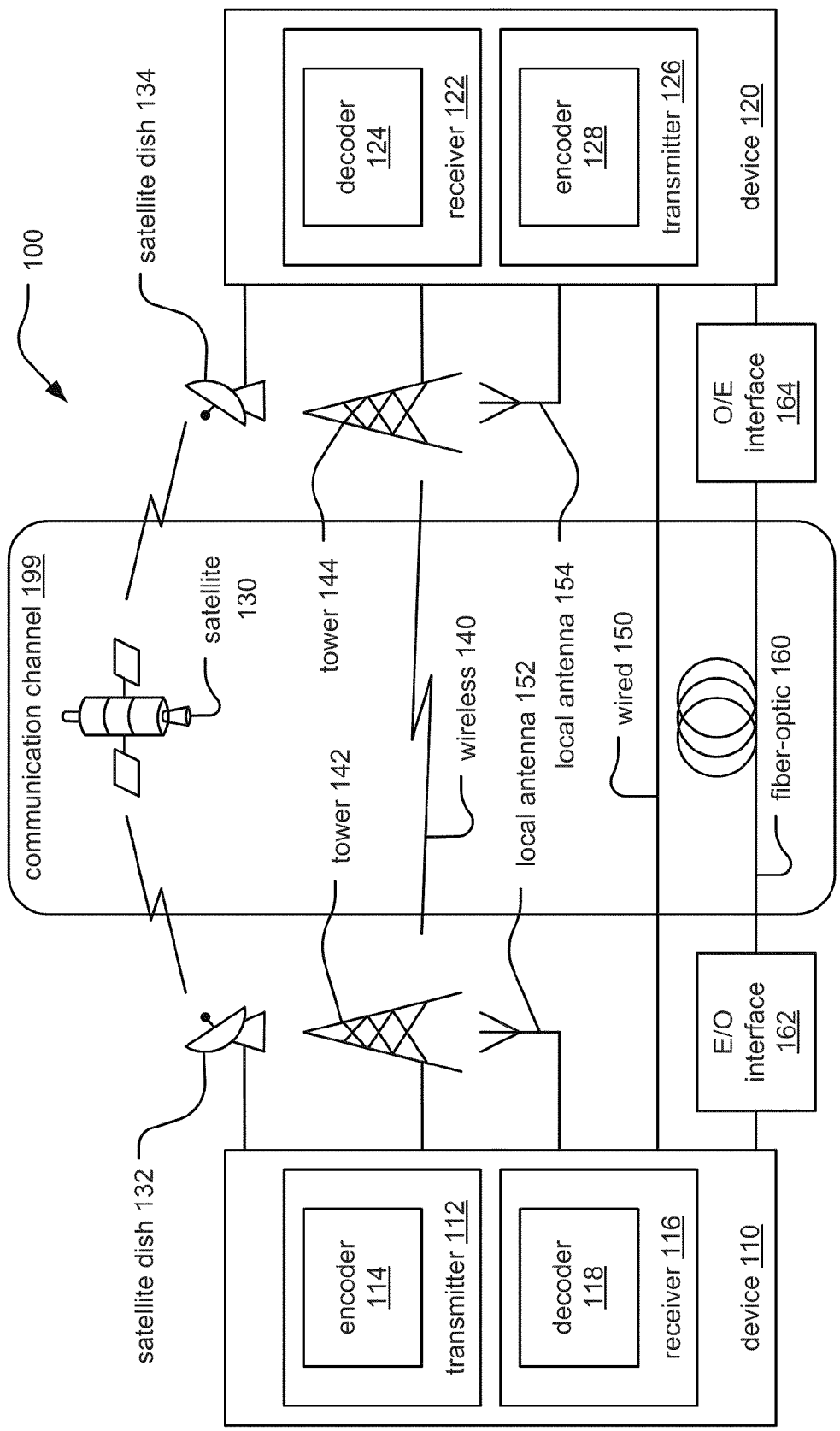
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
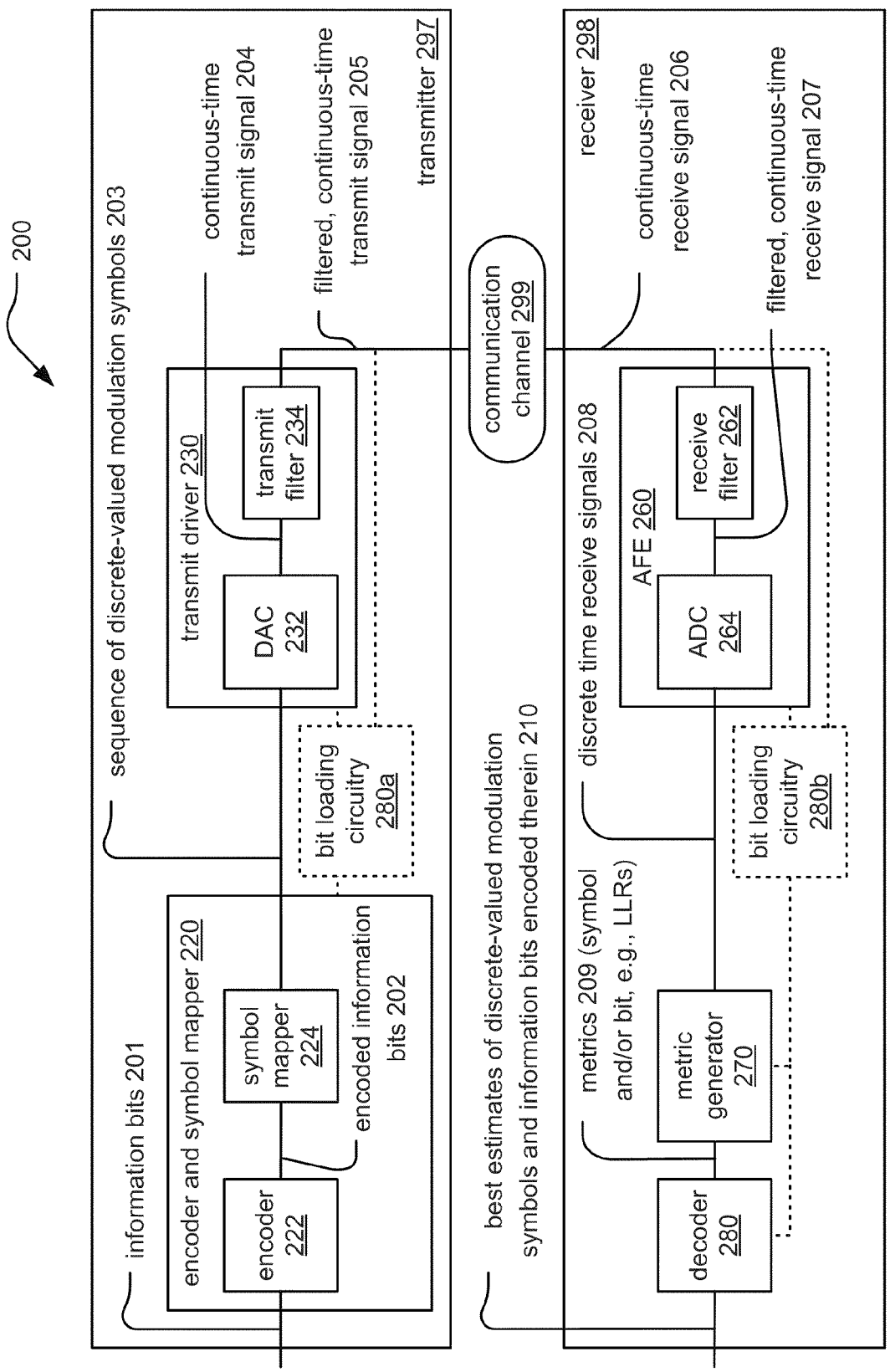

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Any of the various types of LDPC codes described herein can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates metrics 209 (e.g., on either a symbol and/or bit basis) that are employed by a decoder 280 to make best estimates of the discrete-valued modulation symbols and information bits encoded therein 210.

The transmitter 297 may include a bit loading circuitry 280a, and the receiver 298 may include a bit loading circuitry 280b. Based on certain operational conditions, such as noise that affects the communication channel 299, one or more operations within the respective communication devices (e.g., transmitter 297 and receiver 298) may be adaptively modified. For example, the various modules, circuitries, and/ or functional blocks within the transmitter 297 may be adaptively directed to operate in accordance with one or more operational modes based on one or more control signals provided by the bit loading circuitry 280a. Analogously, the various modules, circuitries, and/or functional blocks within the receiver 298 may be adaptively directed to operate in accordance with one or more operational modes based on one or more control signals provided by the bit loading circuitry 280b. In some instances, the type of noise affecting the communication channel is frequency selective and time-varying narrowband ingress noise. Based on this type of noise, or other types of noise, various operations within the communication devices may be adaptively modified as directed by the bit loading circuitries 280a or 280b.

For example, some examples of different operational modes include selecting one or more means of operation from among one or more means of operation. Such operational means performed in accordance with generating signals to be launched into a communication channel and/or received from a communication channel may include, but are not limited to, signaling (e.g., orthogonal frequency division multiplexing (OFDM), code division multiple access (CDMA), time division multiple access (TDMA), and/or any other type of signaling employed), modulation (e.g., constellation and symbol mapping of the constellation points therein), demodulation, metric generation, decoding (such as using a selected LDPC matrix being selected from a number of LDPC matrices), etc.

Moreover, it is noted that in these previous embodiments, as well as other embodiments described herein, various alternative embodiments may include more or fewer modules, functional blocks, and/or circuitries, etc. than specifically depicted within the without departing from various aspects of the scope and spirit of the invention.

The encoders and/or decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. A general description of LDPC codes is provided below as well.

Figure 3:
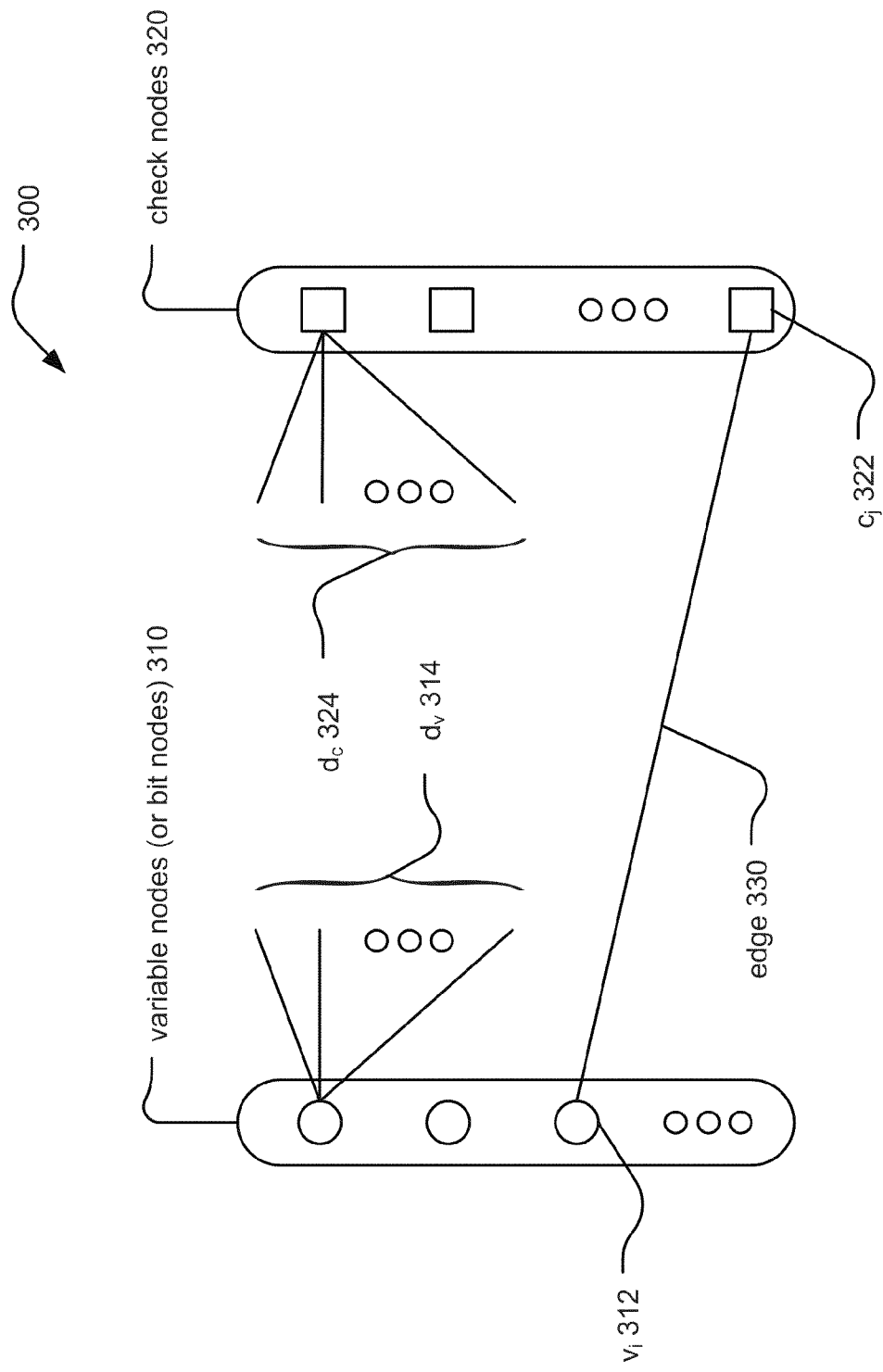
FIG. 3 illustrates an embodiment of an LDPC (Low Density Parity Check) code bipartite graph.

FIG. 3 illustrates an embodiment of an LDPC (Low Density Parity Check) code bipartite graph 300. In the art, an LDPC bipartite graph may also sometimes be referred to as a "Tanner" graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

LDPC codes are linear block codes and hence the set of all codewords $x \in C$ spans the null space of a parity check matrix, H.

$$Hx^T = 0, \forall x \in C \quad (1)$$

For LDPC codes, H, is a sparse binary matrix of dimension m×n. Each row of H corresponds to a parity check and a set element $h_{ij}$ indicates that data symbol j participates in parity check i. Each column of H corresponds to a codeword symbol.

For each codeword x there are n symbols of which m are parity symbols. Hence the code rate r is given by:

$$r = (n-m)/n \quad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_r(i)$, and the number of 1's in the j-th row of the parity check matrix may be denoted as $d_c(j)$. If $d_v(i) = d_v$ for all i, and $d_c(j) = d_c$ for all j, then the LDPC code is called a $(d_v, d_c)$ regular LDPC code, otherwise the LDPC code is called an irregular LDPC code.

LDPC codes were introduced by R. Gallager in [1] referenced below (also in [2] referenced below) and by M. Luby et al. in [3] also referenced below.

[1] R. Gallager, *Low-Density Parity-Check Codes*, Cambridge, Mass.: MIT Press, 1963.

[2] R. G. Gallager, "Low density parity check codes," *IRE Trans. Info. Theory*, vol. IT-8, January 1962, pp. 21-28.

[3] M. G. Luby, M. Mitzenmacher, M. A. Shokrollahi, D. A. Spielman, and V. Stemann, "Practical Loss-Resilient Codes," *Proc. 29th Symp. on Theory of Computing*, 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 (or sometimes referred to as a Tanner graph 300) of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 330 is specifically shown as connecting from the bit node, $v_i$ 312, to the check node, $c_j$ 322. This number of edges (shown as 314) may be referred to as the degree of a variable node i. Analogously, every check node of the M check nodes 320 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by e=(i, j). However, on the other hand, given an edge e=(i, j), the nodes of the edge may alternatively be denoted as by e=(v(e),c(e)) (or e=(b(e), c(e))). Alternatively, the edges in the graph correspond to the set elements of H where a set element $h_{ji}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i) = \{e | v(e) = i\}$ (or by $E_b(i) = \{e | b(e) = i\}$); these edges are referred to as bit edges, and the messages corresponding to these bit edges are referred to as bit edge messages.

Given a check node $c_j$, one may define the set of edges emitting from the node $c_j$ by $E_c(j) = \{e | c(e) = j\}$; these edges are referred to as check edges, and the messages corresponding to these check edges are referred to as check edge messages. Continuing on, the derivative result will be $|E_v(i)| = d_v$ (or $|E_b(i)| = d_b$) and $|E_c(j)| = d_c$.

Generally speaking, any codes that can be represented by a bipartite graph may be characterized as a graph code. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [3] referenced above.

In general, with a graph of an LDPC code, the parameters of an LDPC code can be defined by a degree of distribution, as described within M. Luby et al. in [3] referenced above and also within the following reference [4]:

[4] T. J. Richardson and R. L. Urbanke, "The capacity of low-density parity-check code under message-passing decoding," *IEEE Trans. Inform. Theory*, Vol. 47, No. 2, February 2001, pp. 599-618.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC codes. In addition, in certain embodiments, a first portion of an LDPC matrix (e.g., such as that which corresponds to the information bits) may be regular having the same bit degree therein, while a second portion of an LDPC matrix (e.g., such as that which corresponds to the parity bits) may be either regular or irregular.

It is also noted that many of the embodiments described herein employ the terminology of "bit node" and "bit edge message", or equivalents thereof. Oftentimes, in the art of LDPC decoding, the "bit node" and "bit edge message" are alternatively referred to as "variable node" and "variable edge message", in that, the bit values (or variable values) are those which are attempted to be estimated. Either terminology can be employed in accordance with certain aspects of the invention.

Figure 4:
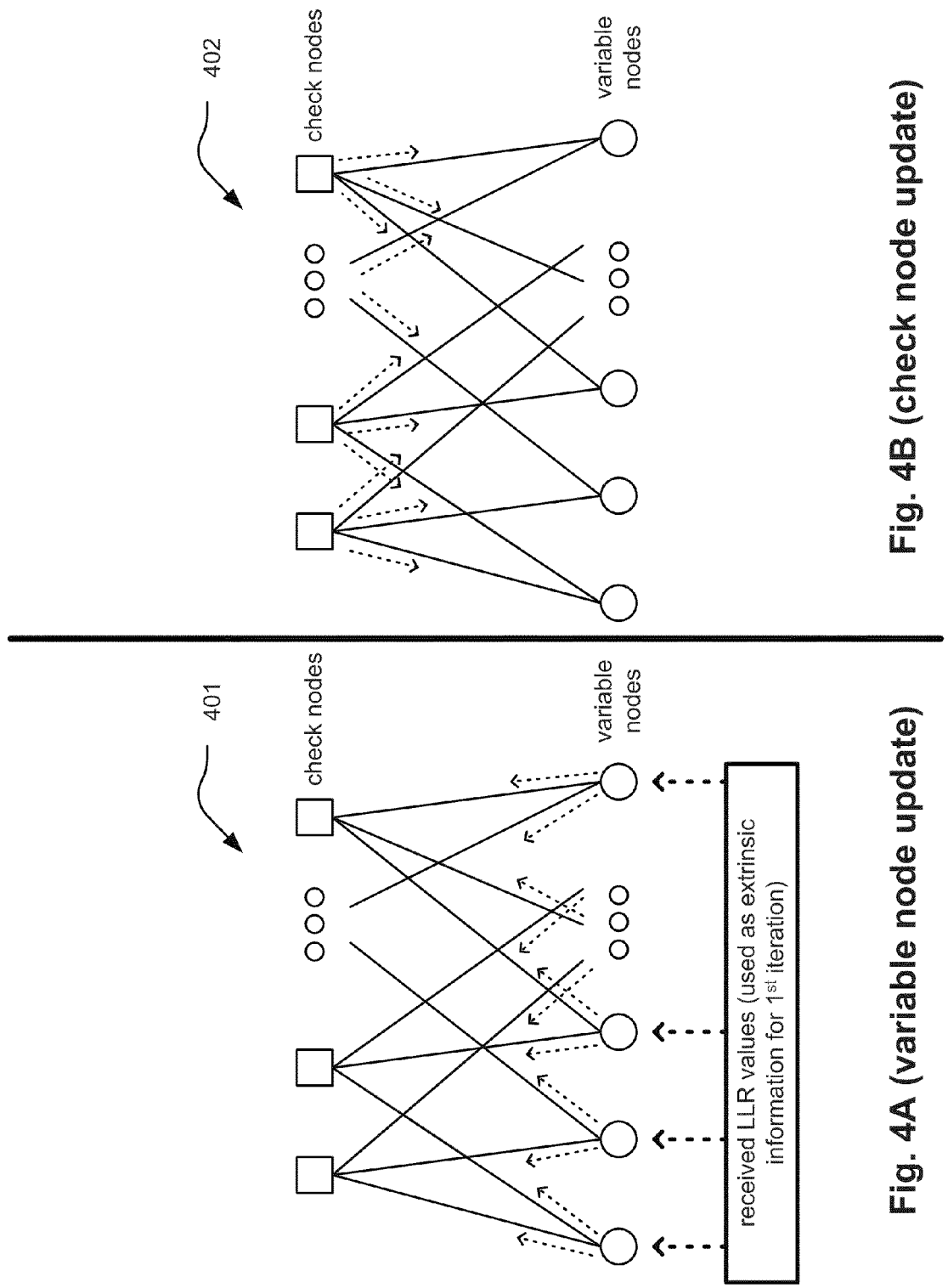
FIG. 4A illustrates an embodiment of variable node update with reference to an LDPC code bipartite graph.
FIG. 4B illustrates an embodiment of check node update with reference to an LDPC code bipartite graph.

FIG. 4A illustrates an embodiment 401 of variable node update with reference to an LDPC code bipartite graph. FIG. 4B illustrates an embodiment 402 of check node update with reference to an LDPC code bipartite graph. These two diagrams may be considered in conjunction with one another.

A signal received from a communication channel undergoes appropriate demodulation (e.g., processing within an analog front end including digital sampling, filtering, gain adjustment, etc.) to generate a received bit sequence. Then, log-likelihood ratios (LLRs) are calculated for each bit location within the received bit sequence. These LLRs correspond respectively to bit nodes of the LDPC code and its corresponding LDPC bipartite graph.

During initialization, the LLRs are employed for the bit edge messages (e.g., extrinsic information) for each edge emanating from each respective variable node. Thereafter, check node processing or check node updating is performed using the original bit edge messages (e.g., the calculated LLRs). These updated check edge messages are then employed to perform bit node processing or bit node updating to update the variable node soft information for use in the next decoding iteration. The variable node soft information is then used to calculate the variable node edge messages (extrinsic information) for this next decoding iteration.

These variable node edge messages are then used in accordance with check node processing or check node updating to calculate updated check edge messages. Subsequently, these most recently updated check edge messages are then employed to perform bit node processing or bit node updating to update the variable node soft information once again.

After a final decoding iteration, which may be determined based on some parameter (e.g., a predetermined number of decoding iterations or when all syndromes of the LDPC code equal zero), the last calculated variable node soft information may undergo hard limiting (e.g., in a slicer) to generate estimates of the bits encoded within the received signal.

In accordance with LDPC coding, quasi-cyclic LDPC codes (as described in reference [5]) have become increasingly popular in recent times.

[5] Marc P. C. Fossorier, "Quasi-Cyclic Low-Density Parity-Check Codes From Circulant Permutation Matrices," *IEEE Trans. Inform. Theory*, Vol. 50, No. 8, August 2004, pp. 1788-1793.

A general description of such a quasi-cyclic LDPC code is that each codeword thereof, after undergoing a cyclic shift, will result in another codeword of the LDPC in most cases; since this is not true necessarily for all codewords of the LDPC code, hence the use of the term "quasi".

Typically, the manner in which such quasi-cycle LDPC codes are constructed in the art is using a brute force approach in which a designer simply tries a large number of variations without any real design methodology. There is no efficient methodology in the prior art by which such quasi-cyclic LDPC codes may be constructed.

Herein, a methodology is presented by which a large number of quasi-cyclic LDPC codes can be constructed in a very efficient manner for comparison and selection of one or more of those LDPC codes to be used in any of a wide variety of communication systems types and communication device types. Any other application context (e.g., including information storage device, etc.) in which ECC may be employed can also use one or more of these LDPC codes.

In addition, the manner presented herein in which LDPC codes may be constructed allows for a designer to compare and employ various sub-matrix sizes of the corresponding LDPC matrices.

Figure 5:
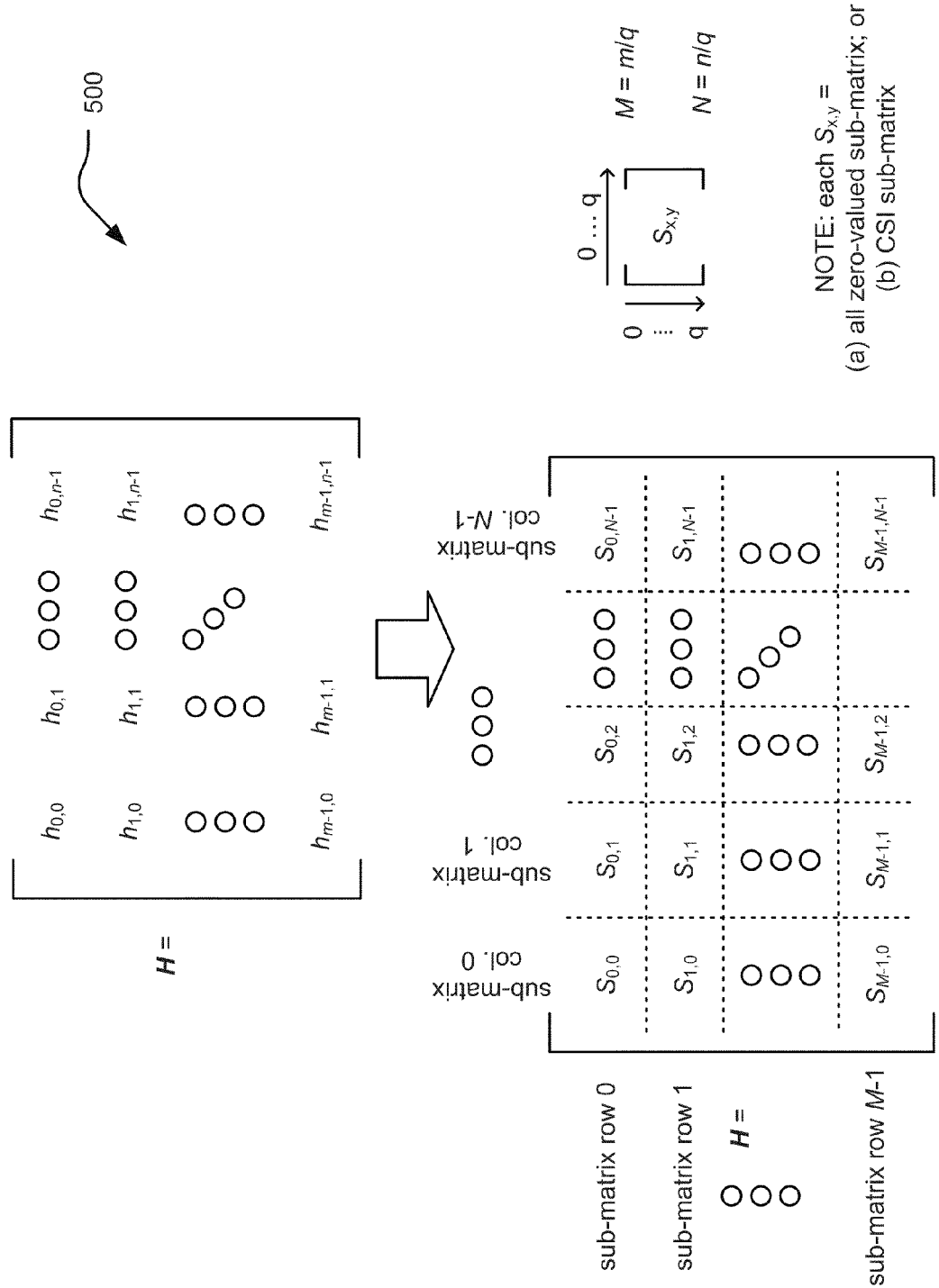
FIG. 5 illustrates an embodiment of the relationship between an overall LDPC matrix and the individual sub-matrices therein that include all zero-valued sub-matrices and/or CSI (Cyclic Shifted Identity) sub-matrices (including the sub-matrix rows and sub-matrix columns of the LDPC matrix).

FIG. 5 illustrates an embodiment 500 of the relationship between an overall LDPC matrix and the individual sub-matrices therein that include all zero-valued sub-matrices and/or CSI (Cyclic Shifted Identity) sub-matrices (including the sub-matrix rows and sub-matrix columns of the LDPC matrix).

A binary LDPC code may be fully described by its parity check matrix (i.e., its LDPC matrix). At the top of FIG. 5, the individual elements of an LDPC matrix, H, are shown:

$$H = \begin{bmatrix} h_{0,0} & h_{0,1} & \cdots & h_{0,n-1} \\ h_{1,0} & h_{1,1} & \cdots & h_{1,n-1} \\ \vdots & \vdots & \ddots & \vdots \\ h_{m-1,0} & h_{m-1,1} & \cdots & h_{m-1,n-1} \end{bmatrix}$$

where n is the number of bits in a codeword, m is the number of parity check equations of the LDPC code, and $h_{i,j}$ is either 0 or 1. An n-bit vector c (e.g., $c=(c_1, c_2, \ldots, c_N)$) is a codeword (i.e., of the LDPC code) if and only if $$Hc^T = 0.$$

For such an LDPC code, the parity matrix H is also composed of a number of q-by-q (i.e., q×q) square sub-matrices as shown in the bottom portion of FIG. 5 and also below:

$$H = \begin{bmatrix} S_{0,0} & S_{0,1} & \ldots & S_{0,N-1} \\ S_{1,0} & S_{1,1} & \ldots & S_{1,N-1} \\ \vdots & \vdots & \ddots & \vdots \\ S_{M-1,0} & S_{M-1,1} & \ldots & S_{M-1,N-1} \end{bmatrix}$$

where M=m/q, N=n/q, and each sub-matrix, $S_{I,J}$, thereof is a q-by-q sub-matrix that is either an all zero-valued sub-matrix (i.e., in which all elements thereof are the value or zero "0") or a CSI (Cyclic Shifted Identity) sub-matrix. A CSI sub-matrix S is characterized by a shift-value, $\lambda(S)$, such that the components of S are defined as follows:

$$s_{i,j} = \begin{cases} 1 & \text{if } i + \lambda(S) = j \pmod{q} \\ 0 & \text{otherwise} \end{cases}$$

for any i and j, with $0 \leq i < q$ and $0 \leq j < q$. For example, the q-by-q identity matrix is itself a CSI matrix with a shift-value $\lambda(S)=0$ (i.e., a CSI sub-matrix that has undergone a cyclic shift of zero "0").

As can be seen, the LDPC matrix (as depicted in the lower portion of the diagram), includes various sub-matrix rows and sub-matrix columns. These sub-matrix rows and sub-matrix columns may be viewed as being based on the sub-matrix construction of the LDPC matrix (e.g., shown as sub-matrix rows 0 through M−1 and sub-matrix columns 0 through N−1).

Certain communication systems and the communication devices therein (e.g., home networks such as implemented between various communication devices within a private home, small business, portion of an apartment complex, etc.) may suffer undesirably from narrowband ingress noise. While many of the illustrative embodiments depicted herein relate to home networking type of communication systems (e.g., multiple communication devices being networked together in a relatively small vicinity such as in accordance with MoCA 2.0 (Multimedia over Coax Alliance 2.0)), the deleterious effects of narrowband ingress noise are certainly not limited only to such types of communication systems and such communication devices implemented therein, and such undesirable narrowband ingress noise may be found in other types of communication systems and among other types of communication devices as well without departing from the scope and spirit of the invention.

Ingress noise may be defined as a frequency selective impairment in contrast with impulse noise. Narrowband ingress noise may be injected into a communication network itself (e.g., a home networking type of communication system). The amplitude of the injected ingress may vary as a function of the propagation condition within the communication system, and such variation may be by as much as 20 dB.

Referring to MoCA 2.0 (Multimedia over Coax Alliance 2.0), MoCA 2.0 includes a number of baseline orthogonal frequency division multiplexing (OFDM) operational parameters including:

Sampling rate: 100 Mega-Hertz (MHz)
Number of sub-carriers: 512
Maximal cyclic prefix (CP) size: 128
Number of available sub-carriers: 480
Maximum constellation size increased to 10 bpcs (bits per channel symbol) (e.g., Quadrature Amplitude Modulation (QAM) 1024)
Maximum PHY rate greater than 740 Mega-bits per second (Mb/s or Mbps) (on a flat channel, with CP=50)

Figure 6:
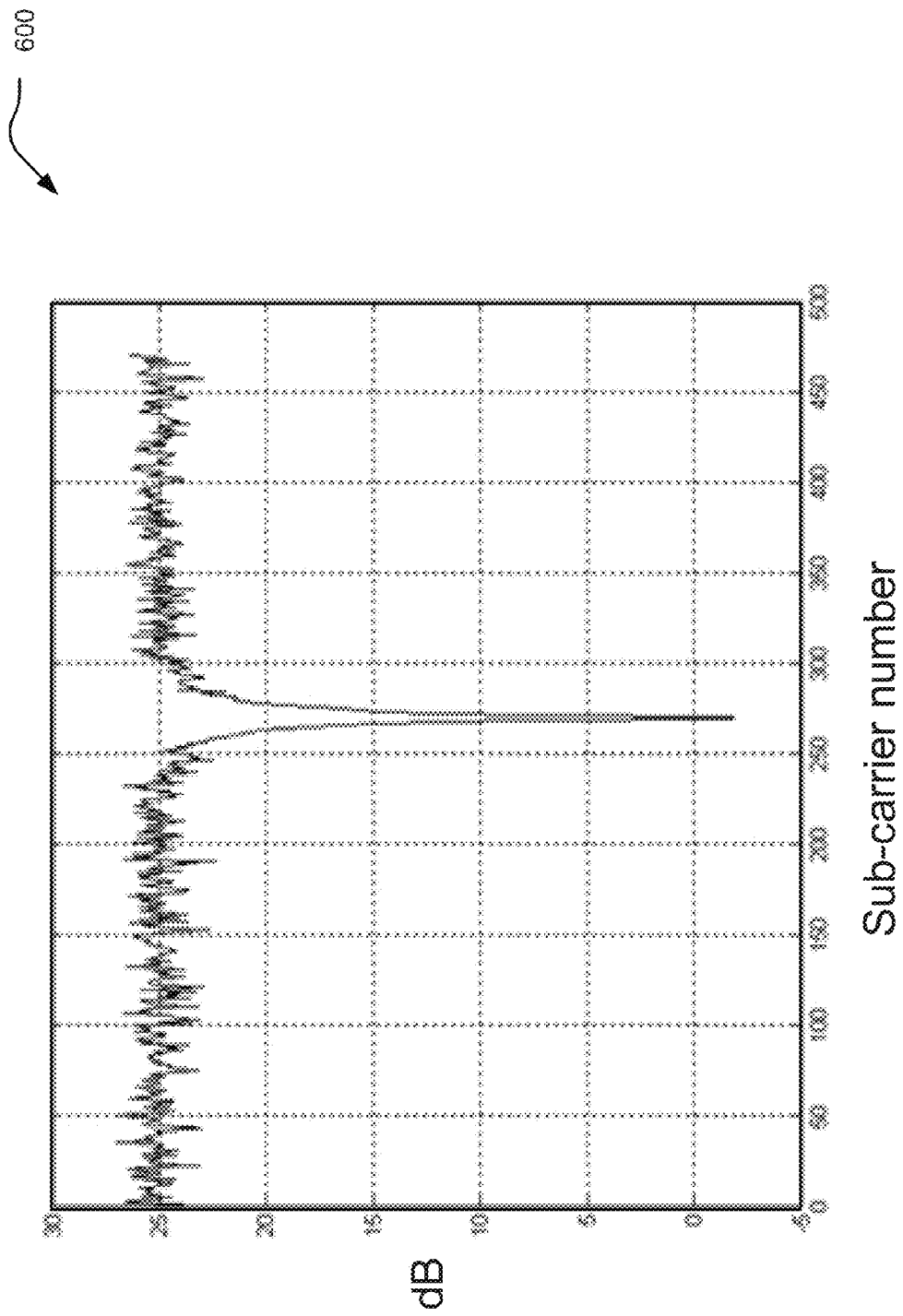
FIG. 6 illustrates an embodiment of signal to noise ratio (SNR) with a single interferer causing ingress noise in an orthogonal frequency division multiplexing (OFDM) operative communication system.

FIG. 6 illustrates an embodiment 600 of signal to noise ratio (SNR) with a single interferer causing ingress noise in an orthogonal frequency division multiplexing (OFDM) operative communication system. In this example, it can be seen that the single interferer incurs a loss of SNR centered on a sub-carrier between 250 and 300 of the available 480 sub-carriers. It is noted that the notation dBc denotes the dB (decibels) related to the carrier.

Figure 7:
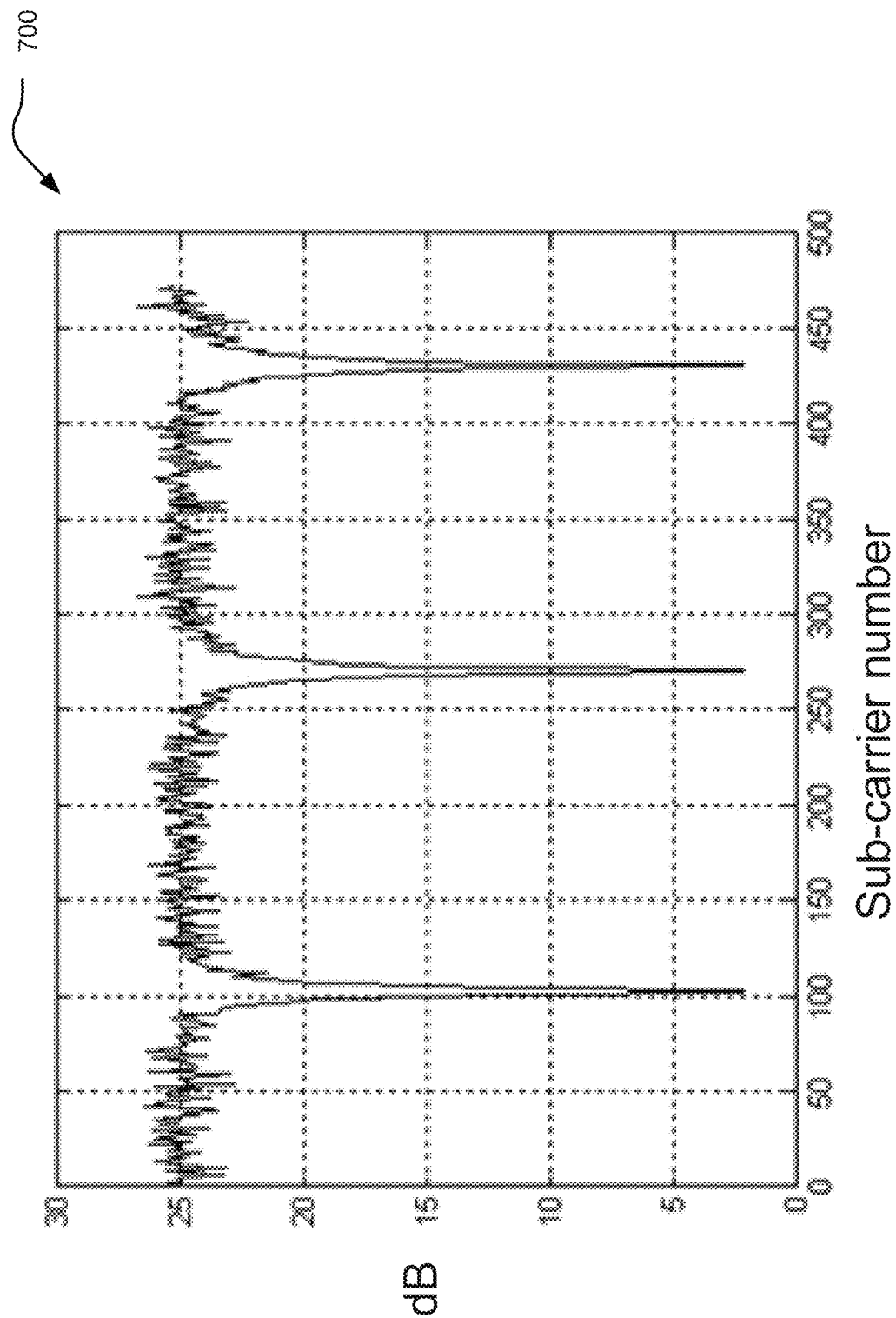
FIG. 7 illustrates an embodiment of SNR with three interferers causing ingress noise in OFDM.

FIG. 7 illustrates an embodiment 700 of SNR with three interferers causing ingress noise in OFDM. In this example, it can be seen that the first interferer incurs a loss of SNR centered on a sub-carrier just greater than 100 of the available 480 sub-carriers. The second interferer incurs a loss of SNR centered on a sub-carrier between 250 and 300 of the available 480 sub-carriers. The third interferer incurs a loss of SNR centered on a sub-carrier between 400 and 450 of the available 480 sub-carriers.

Figure 8:
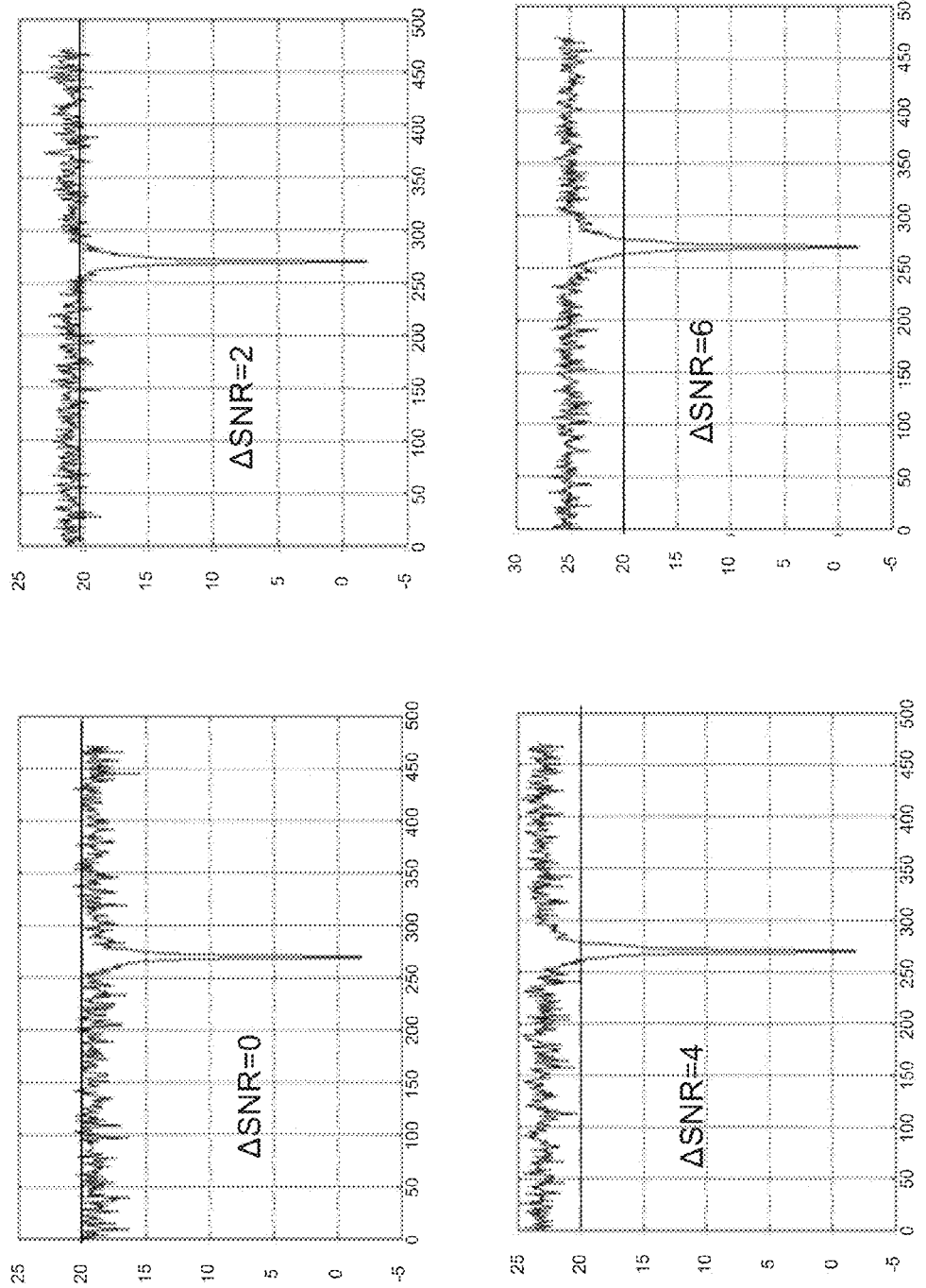
FIG. 8 illustrates various embodiments of $\Delta$SNR (i.e., various changes in SNR) with a single interferer causing ingress noise in OFDM.

FIG. 8 illustrates various embodiments 800 of $\Delta$SNR (i.e., various changes in SNR) with a single interferer causing ingress noise in OFDM. Again in this example, it can be seen that the single interferer incurs a loss of SNR centered on a sub-carrier between 250 and 300 of the available 480 sub-carriers.

Generally speaking, when considering the four examples in this diagram, the depth of the notch caused by the narrowband ingress noise is approximately similar regardless of the change in SNR.

This diagram shows different SNR for the available 480 sub-carriers:

SNR=SNR_NBI_1freq(Atten,ingress_dBc,delta_SNR).
This operates a fixed Atten −60.
The simulation is performed on QAM of sizes 32/64.
The dBc of the ingress is fixed/static, and the $\Delta$SNR does change.

Oftentimes performance diagrams are described in the context of BLER (Block Error Rate) [or BER (Bit Error Rate)] versus $E_b/N_o$ (ratio of energy per bit $E_b$ to the Spectral Noise Density $N_o$) or SNR (Signal to Noise Ratio). This term $E_b/N_o$ is the measure of SNR for a digital communication system. When looking at such performance curves, the BLER [or BER] may be determined for any given $E_b/N_o$ (or SNR) thereby providing a relatively concise representation of the performance of the decoding approach.

FIG. 9 illustrates an embodiment 900 of a performance comparison between an 80% LDPC code and a 90% LDPC code. Within this embodiment and other that describe a code rate or percentage corresponding to an LDPC code, such code rate or percentage may be interpreted to be at the said code rate or percentage within some predetermined tolerance such as 0.1%, 0.3%, 1%, 3%, and/or other tolerance etc.).

As can be seen, the 90% LDPC code has better performance, and both of the codes have an error floor of approximately $1 \times 10^{-4}$.

However, the performance of such rate 90% codes is generally not very good, and this may be attributed to various parameters including: the relatively high code rate of the codes, the sub-matrix size is too small, and/or that the LDPC code is not a regular LDPC code (i.e., it is irregular).

FIG. 10 illustrates an embodiment 1000 of a performance comparison between various LDPC codes whose corresponding LDPC matrices have relatively larger sub-matrix sizes or effective factor (EF). This diagram shows various 90% LDPC codes with different sub-matrix sizes.

For example, a first LDPC code (irregular in nature) has block size of 4640, with code rate 89.7%, and has a sub-matrix size of 80×80. A second LDPC code (regular in nature) has block size of 5800, with code rate 89.7%, and has a sub-matrix size of 100×100.

A third LDPC code (regular in nature) has block size of 10440, with code rate 89.7%, and has a sub-matrix size of 180×180.

A fourth LDPC code (regular in nature) has block size of 14848, with code rate 89.7%, and has a sub-matrix size of 256×256.

As can be seen in the diagram, with a larger sub-matrix size on a 90% LDPC code on 32 QAM can approach nearly the same performance as an 80% LDPC code on 64 QAM.

A combined solution for high rate and narrowband ingress noise (NBI) robustness is presented herein.

Some MoCA 2.0 applications require very high throughput that can approach up to 500 Mbps with 100 MHz bandwidth and 1000 Mbps with 200 MHz bandwidth. To achieve these relatively high rates with the required margin, the high code rate of 90% is required.

Other MoCA 2.0 applications require more robustness to NBI and may trade robustness for NBI noise with throughput. For these applications, a 75% rate code is employed.

To support the two types of applications with the same transceiver, various alternative embodiments may be performed.

Alternative 1:

Use a compromised code of 85% that provides good performance with non-stationary narrow band ingress noise (e.g., X dB better than the 90% code) but compromises of 5% in throughput (compared to 15% with the 75% code).

Alternative 2:

Implement the two codes 75% and 90% on the same MoCA transceiver. The actual applied code is configured either statically by configuration SW or set dynamically by inspecting the level of the non-stationary narrowband ingress noise and by deciding which code to apply according to level of the NBI noise.

The m×n parity check matrix H of a QC (quasi-cyclic)-LDPC code is expanded from a binary base matrix Hb of size $m_b \times n_b$, where $m=m_b \cdot z$ and $n=n_b \cdot z$, with z an integer.

The base matrix is expanded by replacing each 1 in the base matrix with a z×z permutation matrix, and each 0 with a z×z zero matrix (i.e., all elements therein are 0, an all zero-valued sub-matrix). This value of z may be referred to as the sub-matrix size.

The permutations used are circular right shifts, and the set of permutation matrices contains the z×z identity matrix and circular right shifted versions of the identity matrix.

Because each permutation matrix is specified by a single circular right shift, the binary base matrix information and permutation replacement information can be combined into a single compact model matrix $H_{bm}$. The model matrix $H_{bm}$ is the same size as the binary base matrix $H_b$, with each binary entry (i,j) of the base matrix Hb replaced to create the model matrix $H_{bm}$.

Each 0 in $H_b$ is replaced by a blank or "−" negative to denote a z×z zero matrix (i.e., all elements therein are 0, an all zero-valued sub-matrix), and each 1 in $H_b$ size p(i,j)≧0. The model matrix $H_{bm}$ can then be directly expanded to H.

FIG. 11 and FIG. 12 illustrate an embodiment 1100/1200 of an LDPC matrix corresponding to a 74% LDPC code (of an LDPC matrix having form, H=[H₁H₂]; FIG. 11 shows H₁, and FIG. 12 shows H₂.

This LDPC matrix has a form of H=[H₁H₂], and each of the left hand side matrix (H₁) and the right hand side matrix (H₂) includes 15 sub-matrix rows and 29 sub-matrix columns; the total LDPC matrix 15 sub-matrix rows and 58 sub-matrix columns.

Each sub-matrix within the LDPC matrix not depicted by a "−" is a CSI sub-matrix is characterized by a shift-value, λ(S). For example, the sub-matrix located in the 3$^{rd}$ from the top sub-matrix row and the left hand most sub-matrix column has a value of 13, and is therefore a CSI sub-matrix with a shift-value of 13, λ(13). Again, all of the sub-matrices depicted as a "−" are all zero-valued sub-matrices.

The block size of this LDPC code is 4640, and the sub-matrices are all size 80 by 80 (i.e., 80 rows and 80 columns each).

FIG. 13 and FIG. 14 illustrate an embodiment 1300/1400 of an LDPC matrix corresponding to a 84.8% LDPC code (of an LDPC matrix having form, H=[H$_{1a}$H$_{1b}$H₂]; FIG. 13 shows H$_{1a}$, and FIG. 14 shows H$_{1b}$ and H₂.

This LDPC matrix also has a form of H=[H₁H₂], composed of a left hand side matrix (H₁), being composed of both H$_{1a}$ and H$_{1b}$, and a right hand side matrix (H₂), and the overall LDPC matrix includes 7 sub-matrix rows and each of the FIG. 13 and FIG. 14 respectively shows 23 sub-matrix columns of the overall LDPC matrix; the total LDPC matrix 7 sub-matrix rows and 46 sub-matrix columns.

The information bit component of this LDPC matrix, shown as the left hand side matrix (H₁), being composed of both H$_{1a}$ and H$_{1b}$, is regular (as described above, and particularly in regards to this portion of the LDPC matrix having the same bit degree). Ensuring that the left hand side matrix (H₁) is regular, the corresponding LDPC matrix has robustness to ingress noise (such as NBI that may be encountered within home networking type communication systems) and can provide for lower error rates thereby providing greater information throughput and better performance. The right hand side matrix (H₂), which is shown as being lower diagonal in nature in this embodiment, may be irregular.

Each sub-matrix within the LDPC matrix not depicted by a "−" is a CSI sub-matrix is characterized by a shift-value, λ(S). For example, the sub-matrix located in the top sub-matrix row and the left hand most sub-matrix column has a value of 72, and is therefore a CSI sub-matrix with a shift-value of 72, λ(72). Again, all of the sub-matrices depicted as a "−" are all zero-valued sub-matrices (i.e., all of the entries within such sub-matrices are zero in value, 0). The block size of this LDPC code is 4600, and the sub-matrices are all size 100 by 100 (i.e., 100 rows and 100 columns each).

Considering this embodiment 1300/1400 it can be seen that such an LDPC matrix is composed of sub-matrices each having a common size (e.g., 100 by 100 in this instance), and the LDPC matrix is partitioned into a left hand side matrix and a right hand side matrix. Again, the left hand side matrix (H₁) is composed of both H$_{1a}$ and H$_{1b}$, and the right hand side matrix being (H₂). Each sub-matrix within the right hand side matrix, H₂, is an all zero-valued sub-matrix except those sub-matrices identified in (a) and (b): (a) each sub-matrix located on a diagonal of the right hand side matrix being a respective CSI (Cyclic Shifted Identity) sub-matrix, the diagonal extending from an upper left most sub-matrix of the right hand side matrix to a lower right hand sub-matrix of the of the right hand side matrix, and (b) each sub-matrix being located below the diagonal of the right hand side matrix also being a respective CSI sub-matrix. Alternatively, the right hand side matrix may be viewed as being a lower diagonal matrix such that all of the sub-matrices located in the upper right hand portion of the right hand side matrix are all zero-valued sub-matrices.

As can be seen, each respective CSI sub-matrix (that is not an all zero-valued sub-matrix) may have a different and respective CSI value. In some instances, the CSI value of a given CSI sub-matrix is zero (0), making that CSI sub-matrix being an identity sub-matrix or a CSI sub-matrix having undergone a cyclic shift of zero (i.e., having not undergone any cyclic shifting). Also, as can be seen, in some embodiments, each sub-matrix within the left hand side matrix may be a respective CSI sub-matrix (e.g., the left hand side matrix not including any all zero-valued sub-matrices therein), but rather only respective CSI sub-matrices. However, other embodiments may include a left hand side matrix that includes one or more all zero-valued sub-matrix therein). Also, such an LDPC as constructed in accordance with the embodiment 1300/1400 may be a regular LDPC code. However, as mentioned elsewhere herein, irregular LDPC matrices may alternatively be constructed and employed without departing from the scope and spirit of various aspects of the invention.

FIG. 15 and FIG. 16 illustrate an embodiment 1500/1600 of an LDPC matrix corresponding to a 79% LDPC code (of an LDPC matrix having form, H=[$H_1 H_2$]; FIG. 15 shows $H_1$, and FIG. 16 shows $H_2$.

This LDPC matrix also has a form of H=[$H_1 H_2$], and each of the left hand side matrix ($H_1$) and the right hand side matrix ($H_2$) includes 10 sub-matrix rows and 24 sub-matrix columns; the total LDPC matrix 10 sub-matrix rows and 48 sub-matrix columns.

Each sub-matrix within the LDPC matrix not depicted by a "–" is a CSI sub-matrix is characterized by a shift-value, $\lambda(S)$. For example, the sub-matrix located in the top sub-matrix row and the left hand most sub-matrix column has a value of 0, and is therefore a CSI sub-matrix with a shift-value of 0, $\lambda(0)$ [which is an Identity sub-matrix]. Again, all of the sub-matrices depicted as a "–" are all zero-valued sub-matrices.

The block size of this LDPC code is 4608, and the sub-matrices are all size 96 by 96 (i.e., 96 rows and 96 columns each).

FIG. 17 illustrates an embodiment 1700 of a distribution of constellation sizes among various sub-carriers within an OFDM operative communication system. This diagram corresponds to a rate 90% LDPC code.

In this diagram, two different types of modulation symbols are employed: those having 5 bits which are mapped to a 32 QAM constellation, and those having 6 bits which are mapped to a 64 QAM constellation.

This embodiment 1700 shows a relatively close distribution between the 5 bits symbols (32 QAM) and 6 bit symbols (64 QAM) (e.g., 275 to 197).

Considering this diagram as well as other embodiments showing distributions of symbols (of different size or number of bits therein) among various sub-carriers in accordance with OFDM signaling, a communication device may adaptively select a first such distribution from among a plurality of distributions. In addition, in response to or based on a change of one or more operational conditions of a communication system and/or communication device, a communication device may adaptively switch from a first distribution to a second distribution. One such example of such a change may correspond to frequency selective and time-varying narrow-band ingress noise that may undesirably and deleteriously affect a communication channel via which a communication device communicates with at least one additional communication device.

Figure 18:
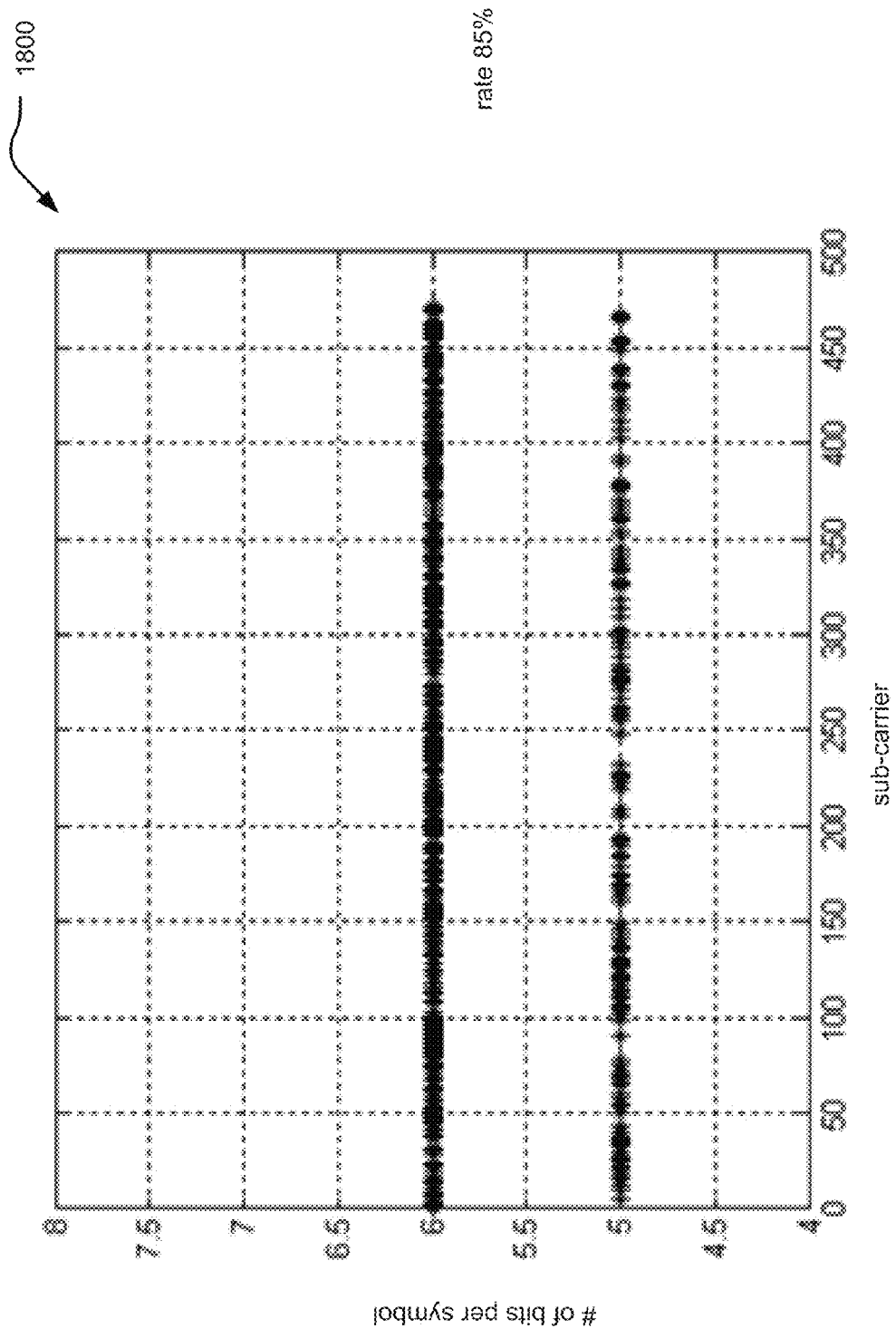
FIG. 18, FIG. 19, and FIG. 20 illustrate various embodiment of distribution of constellation sizes among various sub-carriers within OFDM operative communication systems.
Figure 19:
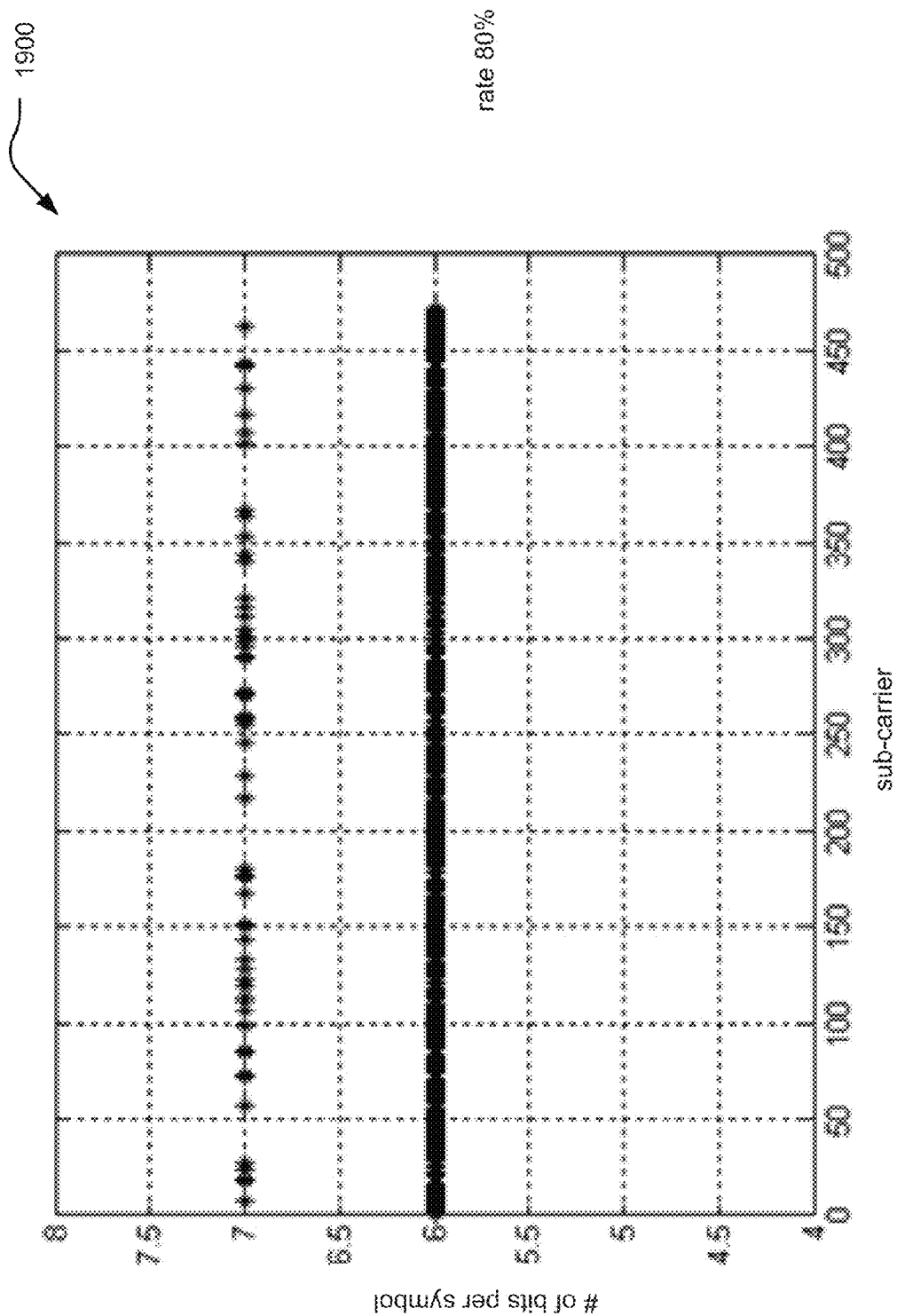
Figure 20:
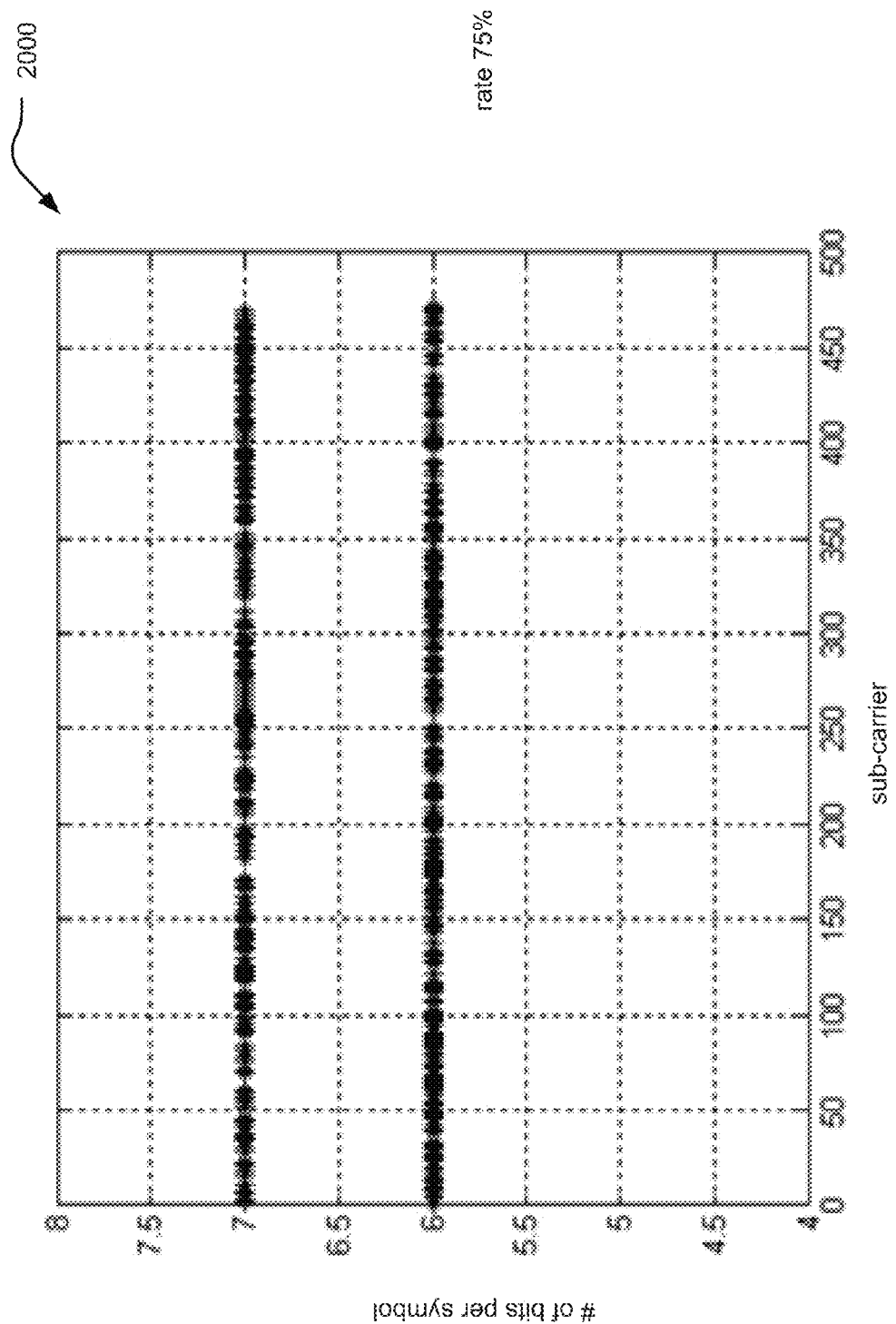

FIG. 18, FIG. 19, and FIG. 20 illustrate various embodiments 1800, 1900, and 2000 of distribution of constellation sizes among various sub-carriers within OFDM operative communication systems.

Referring to embodiment 1800 of FIG. 1800, this diagram corresponds to a rate 85% LDPC code. Also in this diagram, two different types of modulation symbols are employed: those having 5 bits which are mapped to a 32 QAM constellation, and those having 6 bits which are mapped to a 64 QAM constellation.

This embodiment 1800 shows a broader distribution between the 5 bits symbols (32 QAM) and 6 bit symbols (64 QAM) (e.g., 179 to 293).

Referring to embodiment 1900 of FIG. 1900, this diagram corresponds to a rate 80% LDPC code. In this diagram, two different types of modulation symbols are employed: those having 6 bits which are mapped to a 64 QAM constellation, and those having 7 bits which are mapped to a 128 QAM constellation.

This embodiment 1900 shows a very broad distribution between the 6 bit symbols (64 QAM) and 7 bits symbols (128 QAM) and (e.g., 409 to 63).

Referring to embodiment 2000 of FIG. 2000, this diagram corresponds to a rate 75% LDPC code. Also in this diagram, two different types of modulation symbols are employed: those having 6 bits which are mapped to a 64 QAM constellation, and those having 7 bits which are mapped to a 128 QAM constellation.

This embodiment 2000 shows a relatively close distribution between the 6 bit symbols (64 QAM) and 7 bits symbols (128 QAM) and (e.g., 237 to 235).

Figure 21:
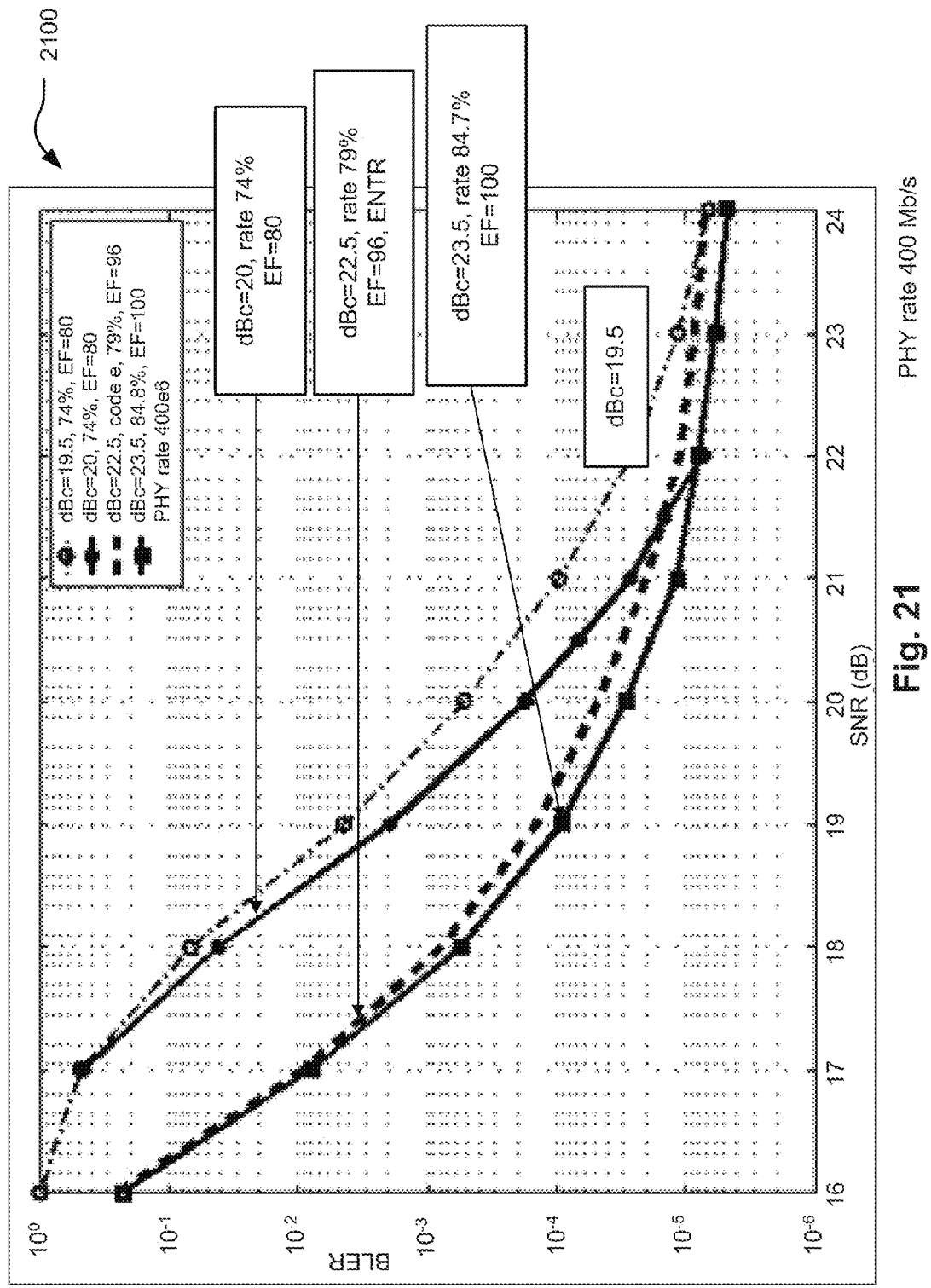
FIG. 21 illustrates an embodiment of a performance comparison between various LDPC codes within an OFDM operative communication system operating at 400 Mega-bits per second (Mb/s or Mbps).

FIG. 21 illustrates an embodiment 2100 of a performance comparison between various LDPC codes within an OFDM operative communication system operating at 400 Mega-bits per second (Mb/s or Mbps).

In consideration of this embodiment 2100 which corresponds to 400 Mb/s, it can be seen that the 79% LDPC code of FIG. 15 and FIG. 16 is less robust than the 74% LDPC code of FIG. 11 and FIG. 12 by approximately 3 dBc. Also, the 79% LDPC code of FIG. 15 and FIG. 16 is only approximately 1 dBc more robust than the 84.8% LDPC code of FIG. 13 and FIG. 14.

Figure 22:
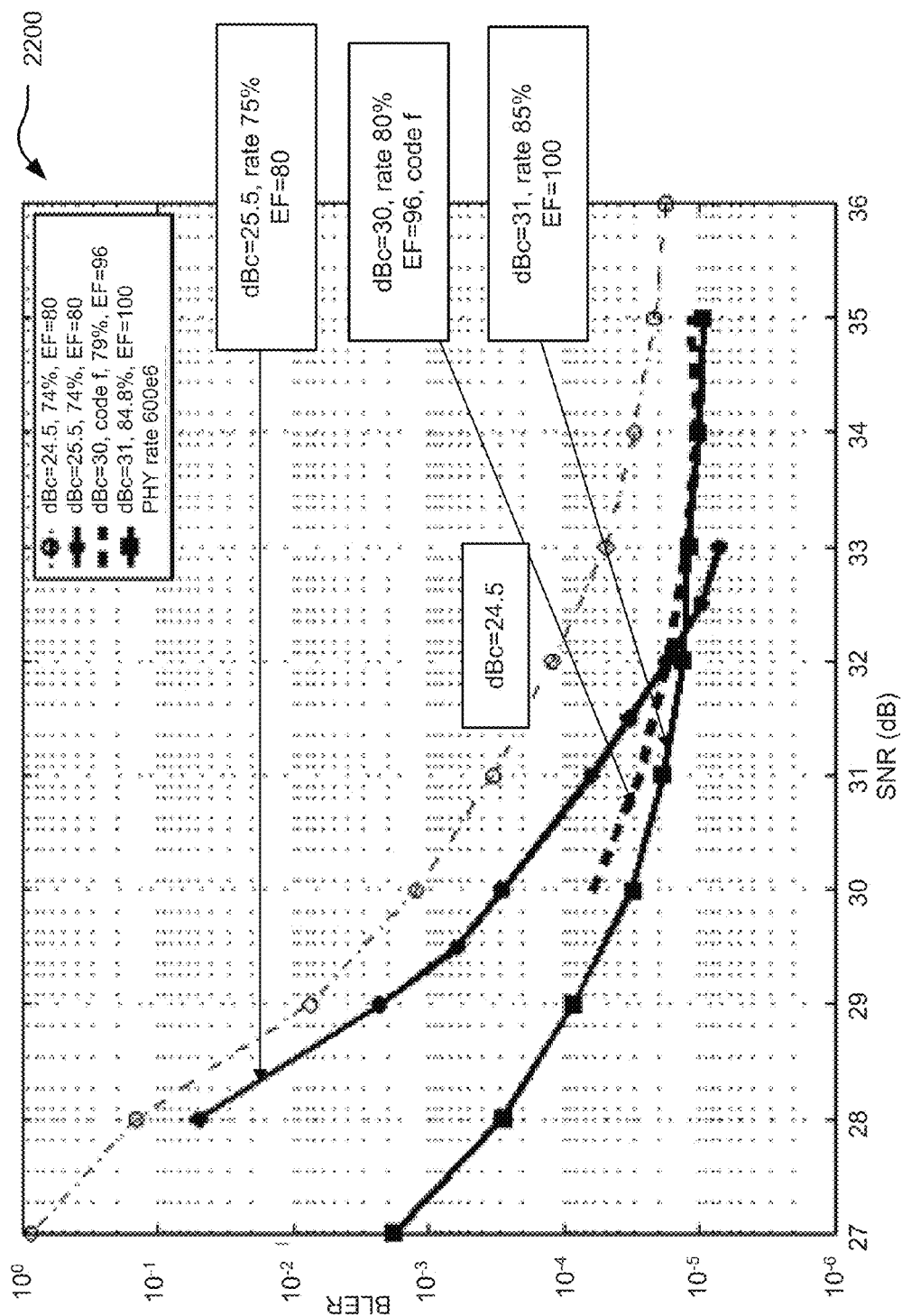
FIG. 22 illustrates an embodiment of a performance comparison between various LDPC codes within an OFDM operative communication system operating at 600 Mb/s.

FIG. 22 illustrates an embodiment 2200 of a performance comparison between various LDPC codes within an OFDM operative communication system operating at 600 Mb/s.

In the context of 600 Mb/s communication systems, distribution of constellation sizes among various sub-carriers within OFDM operative communication systems is described as follows:

Rate 75% LDPC code: 115 9-bit symbols (512 QAM) and 357 10-bit symbols (1024 QAM).

Rate 80% LDPC code: 274 9-bit symbols (512 QAM) and 98 10-bit symbols (1024 QAM).

Rate 85% LDPC code: 198 8-bit symbols (256 QAM) and 274 9-bit symbols (512 QAM).

Rate 90% LDPC code: 410 8-bit symbols (256 QAM) and 62 9-bit symbols (512 QAM).

In consideration of this embodiment 2200 which corresponds to 600 Mb/s, it can be seen that the 79% LDPC code of FIG. 15 and FIG. 16 is less robust than the 74% LDPC code of FIG. 11 and FIG. 12 by approximately 5.5 dBc or 4.5 dBc. Also, the 79% LDPC code of FIG. 15 and FIG. 16 is only approximately 1 dBc more robust than the 84.8% LDPC code of FIG. 13 and FIG. 14.

FIG. 23A illustrates an embodiment of a method 2300 for employing LDPC coding to generate a coded signal that is robust to narrowband ingress noise.

Referring to method 2300 of FIG. 23A, the method 2300 begins by receiving information bits, as shown in a block 2310.

The method 2300 continues by encoding information bits using generator matrix corresponding to LDPC matrix (which is tailored for narrowband ingress noise immunity) thereby generating LDPC code block, as shown in a block 2320. In some embodiments, the generator matrix is merely the LDPC matrix itself. Also, in certain embodiments, the corresponding LDPC code is a systematic code, and LDPC encoding can be employed using this LDPC matrix itself by simply performing back substitution.

The method 2300 then operates by symbol mapping selected bits of LDPC code block using at least one modulation (i.e., at least one constellation with at least one corresponding mapping of constellation points therein) thereby generating modulation symbols, as shown in a block 2330.

The method 2300 continues by converting modulation symbols into continuous-time signal, as shown in a block 2340. The method 2300 then operates by launching continuous-time signal into communication channel, as shown in a block 2350.

FIG. 23B illustrates an embodiment of a method 2301 for selectively employing one type of LDPC coding to reduce and/or minimize the effect of narrowband ingress noise in LDPC coded signals.

Referring to method 2301 of FIG. 23B, the method 2301 begins by implementing a plurality of LDPC codes within a communication device, as shown in a block 2311. The method 2301 then operates by determining a level of non-stationary narrowband ingress noise, as shown in a block 2321. The method 2301 continues by based on the determined level of level of non-stationary narrowband ingress noise, selecting one of the plurality of LDPC codes for reducing and/or minimizing effect of non-stationary narrowband ingress noise in LDPC coded signals, as shown in a block 2331.

FIG. 24 and FIG. 25 illustrate an embodiment of an LDPC matrix corresponding to a 74% regular LDPC code (of an LDPC matrix having form, H=[H$_1$H$_2$]; FIG. 24 shows H$_1$, and FIG. 25 shows H$_2$.

This LDPC matrix also has a form of H=[H$_1$H$_2$], and each of the left hand side matrix (H$_1$) and the right hand side matrix (H$_2$) includes 15 sub-matrix rows and 29 sub-matrix columns; the total LDPC matrix 15 sub-matrix rows and 58 sub-matrix columns.

Each sub-matrix within the LDPC matrix not depicted by a "–" is a CSI sub-matrix is characterized by a shift-value, $\lambda(S)$. For example, the sub-matrix located in the top sub-matrix row and the left hand most sub-matrix column has a value of 6, and is therefore a CSI sub-matrix with a shift-value of 6, $\lambda(6)$. Again, all of the sub-matrices depicted as a "–" are all zero-valued sub-matrices.

The block size of this regular LDPC code is 4640, and the sub-matrices are all size 80 by 80 (i.e., 80 rows and 80 columns each).

The operation of various communication devices in accordance with the various aspects presented herein can employ various types of signaling and modulations. Some examples of types of modulation (e.g., constellations with respective mapping of the constellation points therein) are described below. Generally speaking, a modulation that includes more constellation points therein can carry more information and is less robust (e.g., more susceptible to noise, interference, etc.) than another modulation that includes fewer constellation points therein can carry less information and is more robust (e.g., less susceptible to noise, interference, etc.).

Depending on one or more of the operational conditions or changes of one or more operational conditions of a communication system and/or a communication device, a communication device may adaptively modify any one or more of its operational parameters (e.g., may be viewed as adaptively selecting between various operational modes). For example, a first operational mode may include a first set of operational parameters by which a communication device operates, and a second operational mode may include a second set of operational parameters by which the communication device operates. The adaptive modification between operational modes may involve switching between as few as one operational parameter to another.

Figure 26:
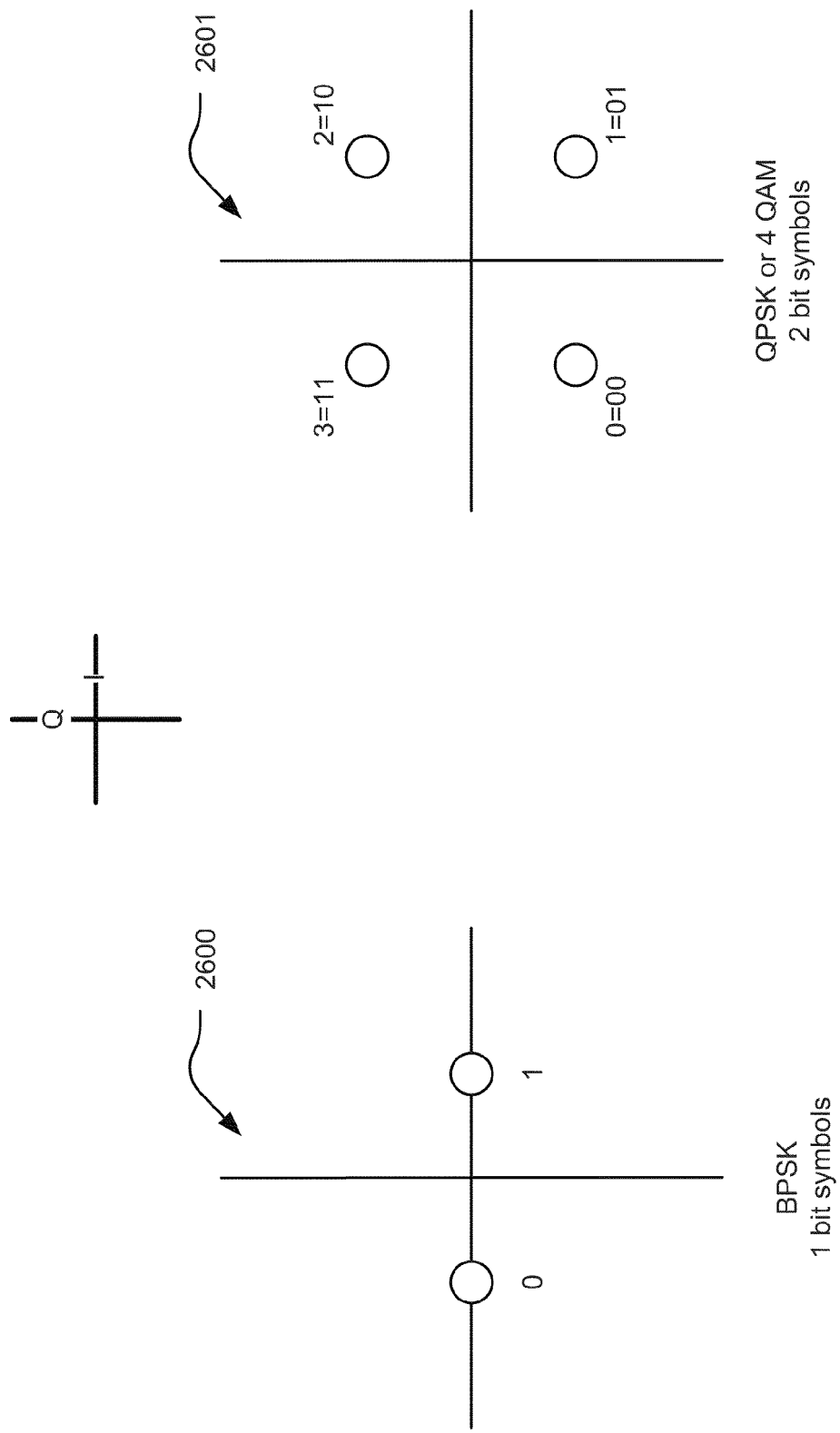
FIG. 26 illustrates embodiments of a binary phase shift keying (BPSK) modulation and a quadrature phase shift keying (QPSK) modulation (or a 4 quadrature amplitude modulation (4 QAM)).

FIG. 26 illustrates embodiments of a binary phase shift keying (BPSK) modulation, shown by reference numeral 2600, and a quadrature phase shift keying (QPSK) modulation (or a 4 quadrature amplitude modulation (4 QAM)), shown by reference numeral 2601.

A BPSK modulation includes only 2 constellation points there, and a singular bit is mapped to one of the constellation points. In such a BPSK constellation, the single bit may be viewed as being a pone bit symbol. A QPSK modulation includes 4 constellation points therein, and 2 bit symbol is mapped to one of the constellation points.

Figure 27:
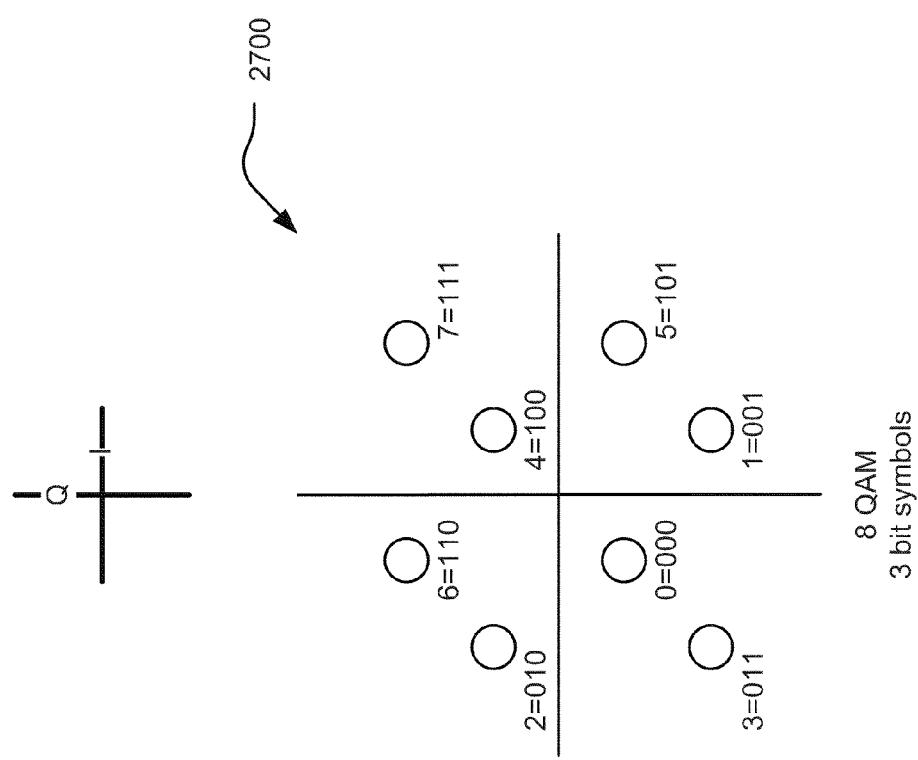
FIG. 27 illustrates embodiments of 8 QAM.

FIG. 27 illustrates embodiments of 8 QAM, shown by reference numeral 2700.

With respect to the 8 QAM, the 8 QAM is one variant of a $2^{2n+1}$ QAM type modulation. A description of a $2^{2n+1}$ QAM type modulation is provided below.

A $2^{2n+1}$ QAM type modulation operates on symbols having 2n+1 bits, where n is an integer. For example, if n=1, then the $2^{2n+1}$ QAM type modulation is 8 QAM as shown with respect to reference numeral 2701 in FIG. 27. Again, a $2^{2n+1}$ QAM type modulation operates on symbols having 2n+1 bits, such that the various bits of the symbol are depicted as $(a_{2n}, a_{2n-1}, a_{2n-2}, \ldots, a_1, a_0) \to (I, Q)$ and are mapped in accordance with in-phase and quadrature axes of the particular modulation's constellation. Such a $2^{2n+1}$ QAM type modulation is not necessarily a square constellation in accordance with other QAM type modulations, and such a$^{2n+1}$ QAM type modulation itself includes $2^{2n+1}$ constellation points. In accordance with the various symbols employed within a $2^{2n+1}$ QAM type modulation, the first two most significant bits (MSBs), namely, $a_{2n}, a_{2n-1}$, determine the quadrant, as defined by the (I, Q) axes, in which the remainder of the bits are symbol mapped.

For example, if the first two MSBs, $a_{2n}, a_{2n-1}$, are (0,0)→(+,+) [which is the upper right hand quadrant]. Alternatively, if the first two MSBs, $a_{2n}, a_{2n-1}$, are (0,1)→(−,+) [which is the upper left hand quadrant]. If the first two MSBs, $a_{2n}, a_{2n-1}$, are (1,1)→(−,−) [which is the lower left hand quadrant]. Also, if the first two MSBs, $a_{2n}, a_{2n-1}$, are, (1,0)→(+,−) [which is the lower right hand quadrant].

Figure 28:
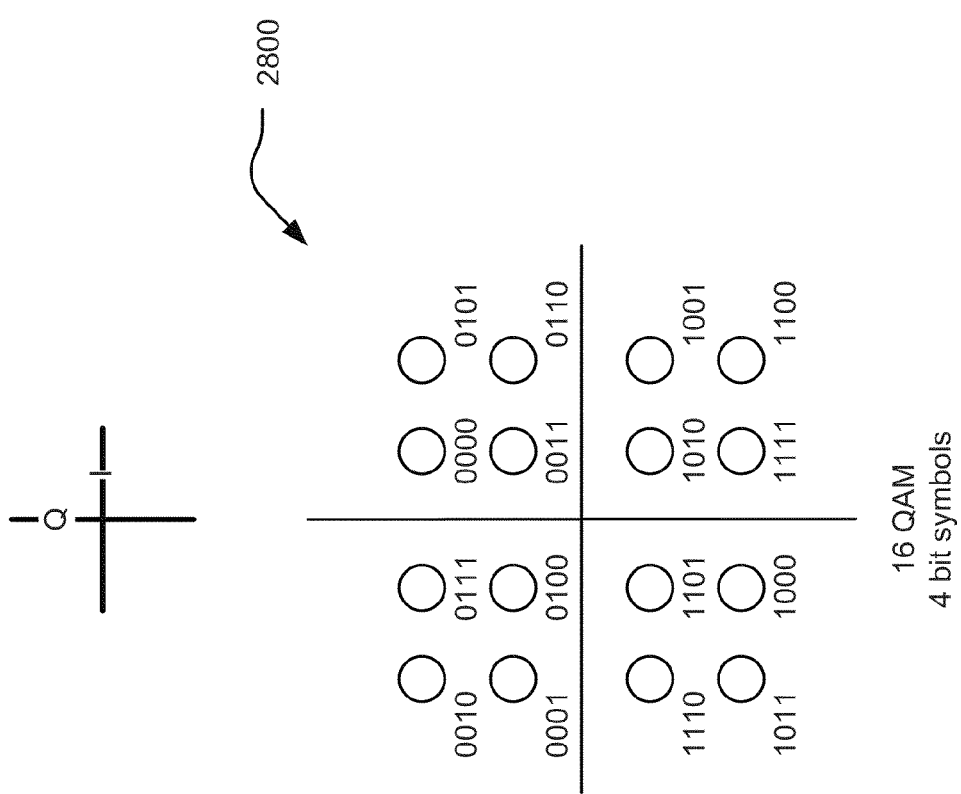
FIG. 28 illustrates an embodiment of 16 QAM.

Referring again to the 8 QAM shown with respect to reference numeral 2701 of FIG. 27, the constellation points therein may be viewed as being a subset of the constellation points within a 16 QAM (e.g., see FIG. 28 for one such example). It is of course noted that a different subset of such a 16 QAM may alternatively be selected to form a 8 QAM in other embodiments.

FIG. 28 illustrates an embodiment of 16 QAM, shown by reference numeral 2800.

Figure 29:
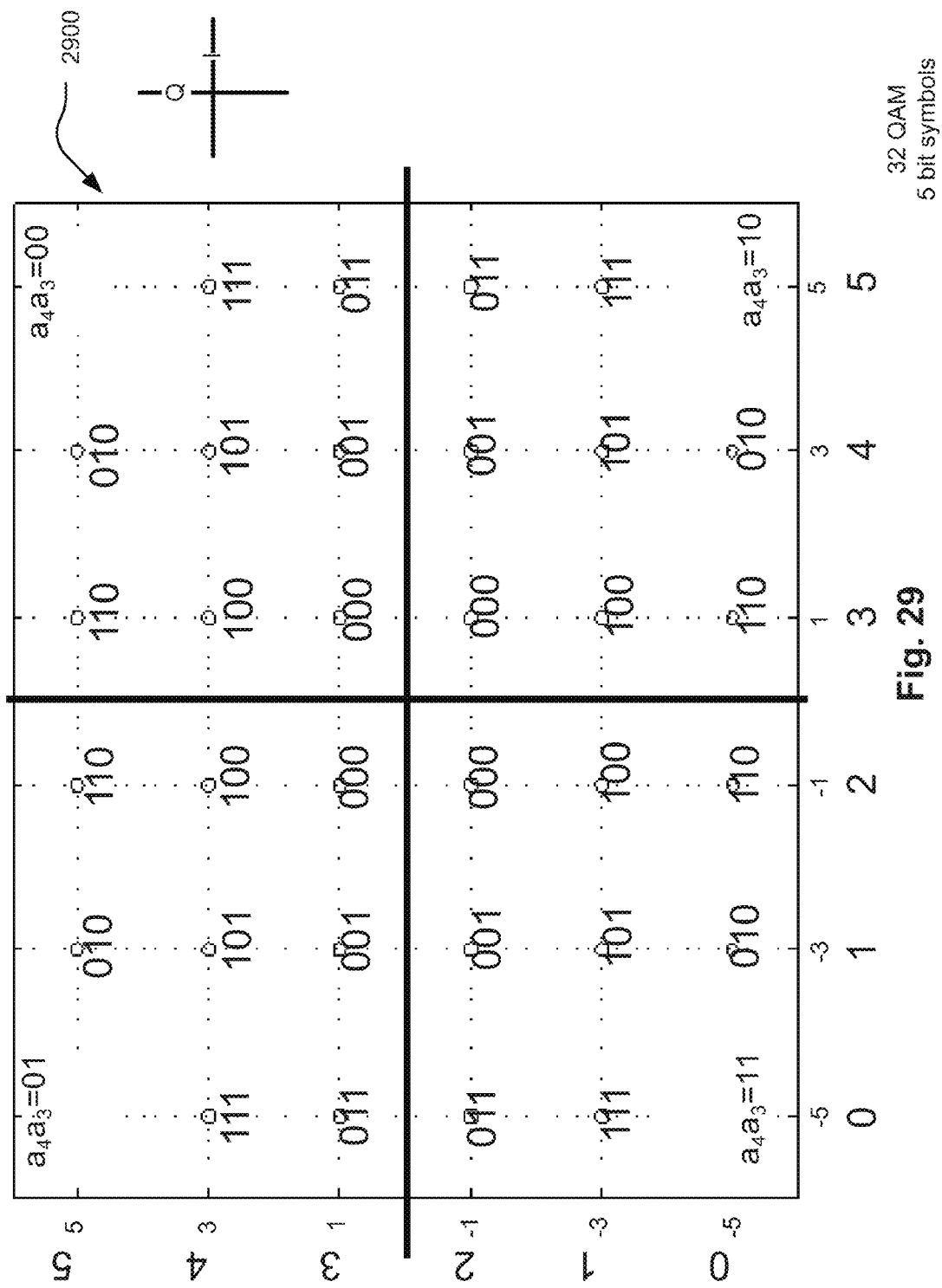
FIG. 29 illustrates an embodiment of 32 QAM.

FIG. 29 illustrates an embodiment of 32 QAM, shown by reference numeral 2900. As can be seen in this embodiment, first two MSBs, $a_4, a_3$, of the 5 bit symbols are those that select which one of the four quadrants in which the remaining 3 bits, $a_2$, $a_1$, $a_0$, are to be symbol mapped. Each of the four quadrants consequently includes 8 respective constellation points therein.

Figure 30:
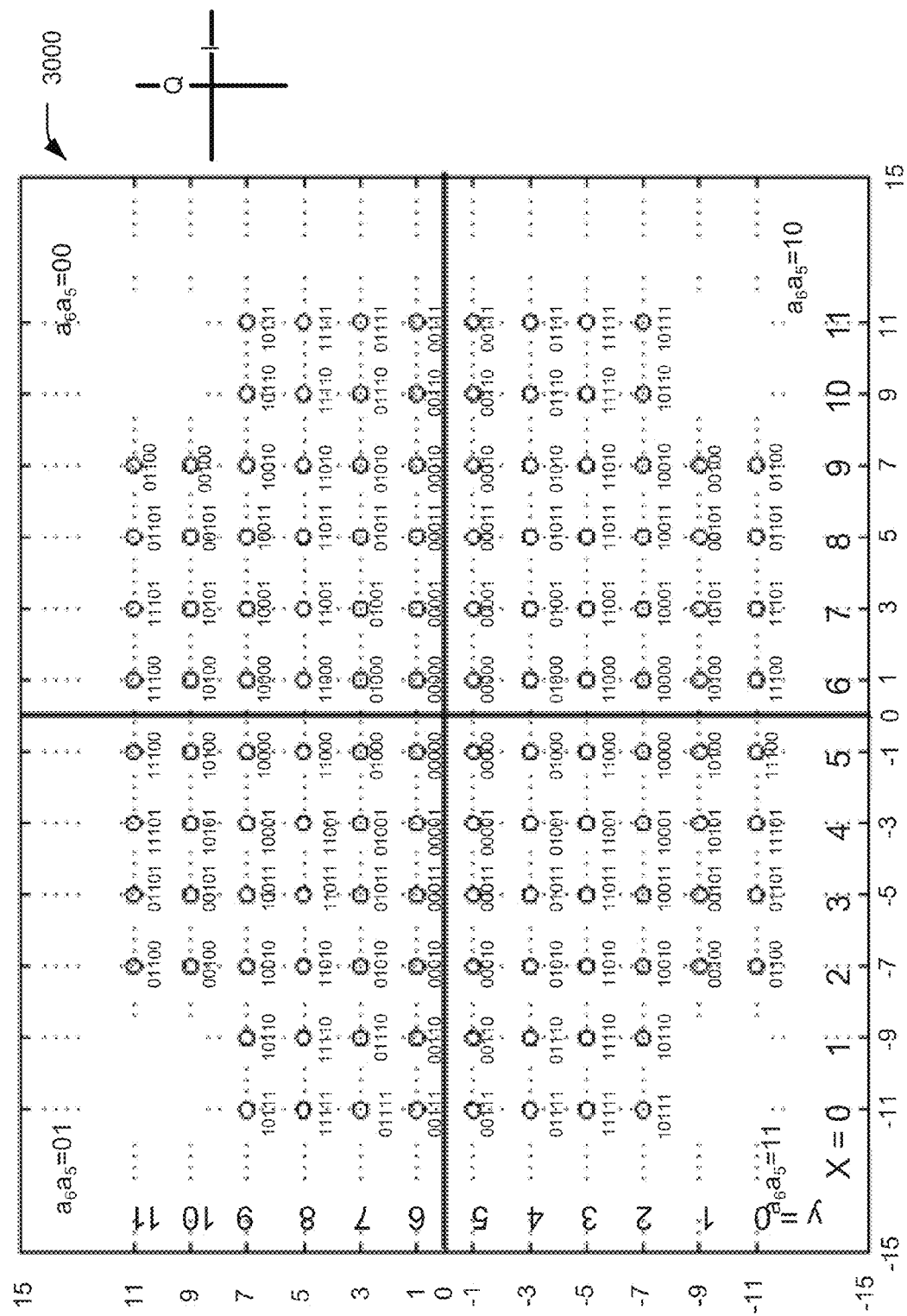
FIG. 30 illustrates an embodiment of 128 QAM.

FIG. 30 illustrates an embodiment of 128 QAM, shown by reference numeral 3000. As can be seen in this embodiment, first two MSBs, $a_6$, $a_5$, of the 7 bit symbols are those that select which one of the four quadrants in which the remaining 5 bits, $a_4$, $a_3$, $a_2$, $a_1$, $a_0$, are to be symbol mapped. Each of the four quadrants consequently includes 32 respective constellation points therein.

Figure 31:
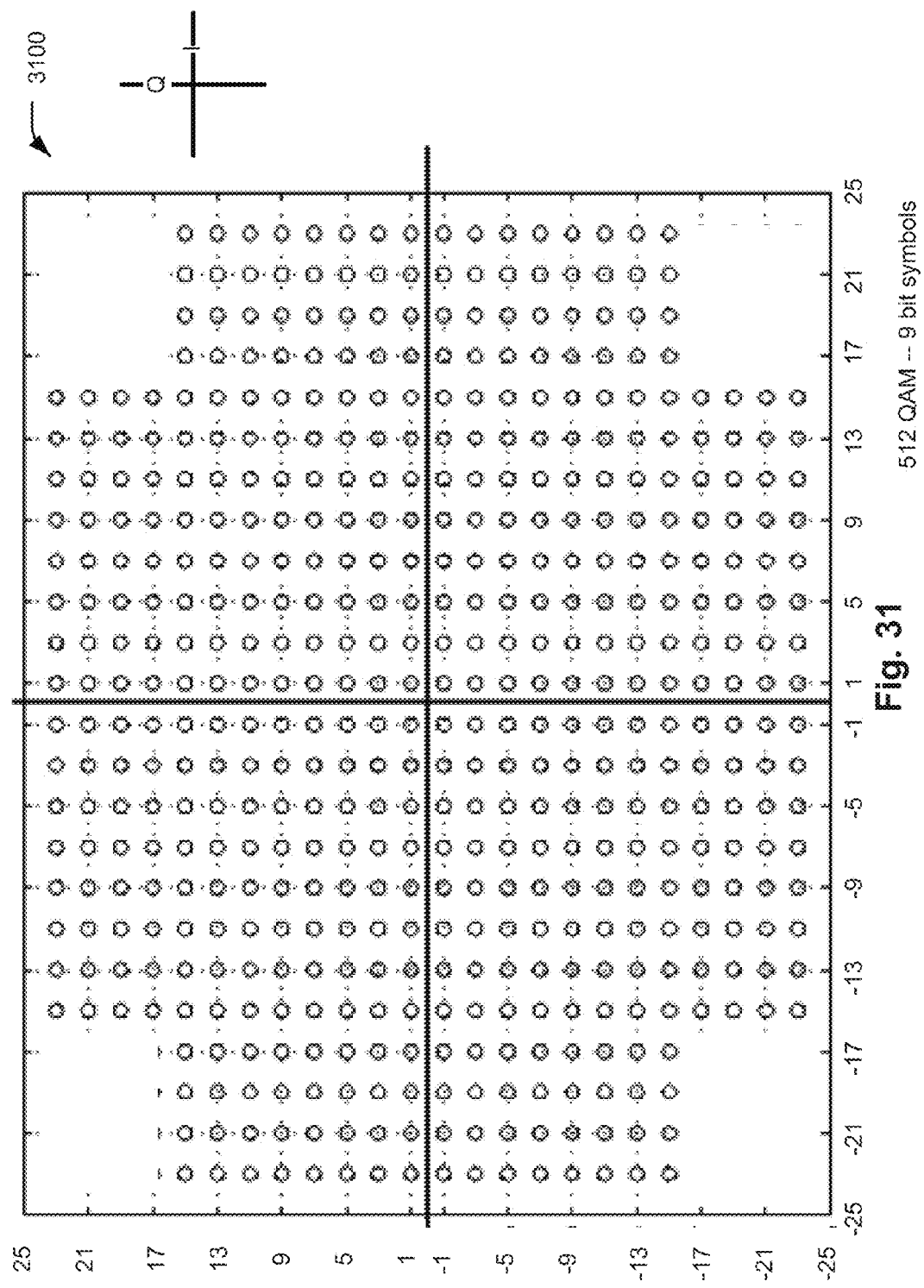
FIG. 31 illustrates an embodiment of 512 QAM.

FIG. 31 illustrates an embodiment of 512 QAM, shown by reference numeral 3100. As can be seen in this embodiment, first two MSBs, $a_8$, $a_7$, of the 9 bit symbols are those that select which one of the four quadrants in which the remaining 7 bits, $a_6$, $a_5$, $a_4$, $a_3$, $a_2$, $a_1$, $a_0$, are to be symbol mapped. Each of the four quadrants consequently includes 128 respective constellation points therein.

Within these embodiments as well as other depicted herein, it is noted that any particular symbol mapping depicted therein is but one possible variant. Also, the listed modulations and respective constellation shapes shown therein is not an exhaustive list of those modulations that may be employed in various embodiments. Other known in the art may alternatively be employed without departing from the scope and spirit of the invention.

The symbol mapping of the constellation points within a given modulation may be adaptively or dynamically modified. For example, the constellation points within a modulation having may be symbol mapped in accordance with a first symbol mapping at a first time, and the constellation points within a similarly shaped modulation may be symbol mapped in accordance with second symbol mapping at a second time.

The adaptive modification may be made from a first modulation to a second modulation entirely, or alternatively, from a first symbol mapping of a modulation to a second symbol mapping of that very same modulation (i.e., the same shaped constellation with at least two different mappings thereof), may be performed in response to or based on a change of one or more operational conditions of a communication system and/or communication device, a communication device may adaptively switch from a first distribution to a second distribution. Again, one such example of such a change may correspond to frequency selective and time-varying narrowband ingress noise that may undesirably and deleteriously affect a communication channel via which a communication device communicates with at least one additional communication device.

FIG. 32A illustrates an embodiment of a method 3200 for operating a communication device. Referring to method 3200 of FIG. 32A, the method 3200 begins by operating communication device in accordance with first operational mode, as shown in a block 3210. The method 3200 continues by monitoring one or more operational parameters including any change thereof (e.g., communication channel noise of various types, communication device status, BER, SNR, etc.), as shown in a block 3220. Based on monitored one or more operational parameters or change thereof, the method 3200 then operates by operating communication device in accordance with second operational mode, as shown in a block 3230.

As mentioned elsewhere herein, depending on one or more of the operational conditions or changes of one or more operational conditions of a communication system and/or a communication device, a communication device may adaptively modify any one or more of its operational parameters (e.g., may be viewed as adaptively selecting between various operational modes). For example, a first operational mode may include a first set of operational parameters by which a communication device operates, and a second operational mode may include a second set of operational parameters by which the communication device operates. The adaptive modification between operational modes may involve switching between as few as one operational parameter to another; in other words, two different operational modes may include nearly the entirely the same operational parameters save one operational parameter. Clearly, in other embodiments, multiple operational parameters may be modified when switching from one operational mode to another.

FIG. 32B illustrates an alternative embodiment of a method 3201 for operating a communication device. Referring to method 3201 of FIG. 32B, the method 3201 begins by operating communication device using first symbol distribution in accordance with OFDM signaling, as shown in a block 3211. The method 3201 then operates by detecting change of noise (e.g., frequency selective and time-varying narrowband ingress noise of communication channel), as shown in a block 3221. The method 3201 continues by operating communication device using second symbol distribution in accordance with OFDM signaling, as shown in a block 3231.

For example, various embodiments herein relate to distributions between symbols of different sizes that are distributed between various sub-carriers in accordance with OFDM signaling. In response to the change of noise, a communication device may be operated to switch from a first symbol distribution to a second symbol distribution.

FIG. 33A and FIG. 33B illustrate various alternative embodiments of methods 3300 and 3301 for operating a communication device. Referring to method 3300 of FIG. 33A, the method 3300 begins by operating communication device using first modulation (e.g., first constellation and first mapping), as shown in a block 3310. The method 3300 continues by detecting change of noise (e.g., frequency selective and time-varying narrowband ingress noise of communication channel), as shown in a block 3320. The method 3300 then operates by operating communication device using second modulation (e.g., second constellation and second mapping), as shown in a block 3330.

For example, various embodiments herein relate to various types of modulations that may be employed in accordance with symbol mapping and demodulation. In response to the change of noise, a communication device may be operated to switch from a first modulation to a second modulation. In one particular embodiment, when there is an increase in noise, a communication device may be operated to switch from a first modulation that has a larger number of constellation points therein to a second modulation that has a fewer number of constellation points therein. For example, as the noise increases, the communication device may be operated to switch to a more robust modulation (that may provide for less overall throughput but will still operate in accordance with an acceptable error rate).

Alternatively, when there is a decrease in noise, a communication device may be operated to switch from a first modulation that has a fewer number of constellation points therein to a second modulation that has a larger number of constellation points therein. For example, as the noise decreases, the communication device may be operated to switch to a less robust modulation that may provide for a greater throughput.

Referring to method 3301 of FIG. 33B, the method 3301 begins by operating communication device using first modulation (e.g., first constellation and first mapping), as shown in a block 3311. The method 3301 then operates by detecting change of noise (e.g., frequency selective and time-varying narrowband ingress noise of communication channel), as shown in a block 3321. The method 3301 continues by operating communication device using second modulation (e.g., first constellation and second mapping), as shown in a block 3331. In this embodiment, the first and second modulations have the same constellation but each has a different respective symbol mapping therein.

It is noted that the various modules and/or circuitries (e.g., encoding modules and/or circuitries, decoding modules and/or circuitries, other modules, other functional blocks, other circuitries, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory (ROM), random access memory (RAM), volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

It is also noted that any of the connections or couplings between the various modules, circuits, functional blocks, components, devices, etc. within any of the various diagrams or as described herein may be differently implemented in different embodiments. For example, in one embodiment, such connections or couplings may be direct connections or direct couplings there between. In another embodiment, such connections or couplings may be indirect connections or indirect couplings there between (e.g., with one or more intervening components there between). Of course, certain other embodiments may have some combinations of such connections or couplings therein such that some of the connections or couplings are direct, while others are indirect. Different implementations may be employed for effectuating communicative coupling between modules, circuits, functional blocks, components, devices, etc. without departing from the scope and spirit of the invention.

Various aspects of the present invention have also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

Various aspects of the present invention have been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, various aspects of the present invention are not limited to such embodiments. It will be obvious to one of average skill in the art that various changes and modifications may be practiced within the spirit and scope of the invention, as limited only by the scope of the appended claims.

What is claimed is:

1. An apparatus, comprising:
an input for receiving an LDPC (Low Density Parity Check) coded signal; and
an LDPC decoder for employing an LDPC matrix for decoding the LDPC coded signal to make an estimate of an information bit encoded therein; and wherein:
the LDPC matrix, composed of a plurality of sub-matrices each having a common size, being partitioned into a left hand side matrix and a right hand side matrix; and
each sub-matrix within the right hand side matrix being an all zero-valued sub-matrix except those sub-matrices identified in (a) and (b):
  (a) each sub-matrix located on a diagonal of the right hand side matrix being a respective one of a first plurality of CSI (Cyclic Shifted Identity) sub-matrices, the diagonal extending from an upper left most sub-matrix of the right hand side matrix to a lower right hand sub-matrix of the of the right hand side matrix; and
  (b) each sub-matrix being located below the diagonal of the right hand side matrix also being a respective one of a second plurality of CSI sub-matrices.

2. The apparatus of claim 1, wherein:
each sub-matrix within the left hand side matrix being a respective one of a third plurality of CSI sub-matrices.

3. The apparatus of claim 1, wherein:
at least one of the sub-matrices in the left hand side matrix being an identity sub-matrix or a CSI sub-matrix having undergone a cyclic shift of zero.

4. The apparatus of claim 1, further comprising:
an analog front end (AFE); and wherein:
the LDPC coded signal being received from a communication channel being affected from frequency selective and time-varying narrowband ingress noise;
during a first time, the input receiving the LDPC coded signal including a first plurality of symbols each having a first number of bits and a second plurality of symbols each having a second number of bits such that first plurality of symbols and the second plurality of symbols being distributed among a plurality of sub-carriers in accordance with orthogonal frequency division multiplexing (OFDM) signaling in accordance with a first distribution; and
based on a change of the frequency selective and time-varying narrowband ingress noise affecting the communication channel, during a second time, the input receiving the LDPC coded signal including a third plurality of symbols each having the first number of bits and a fourth plurality of symbols each having the second number of bits such that third plurality of symbols and the fourth plurality of symbols being distributed among a plurality of sub-carriers in accordance with OFDM signaling in accordance with a second distribution;

the AFE extracting the first plurality of symbols and the second plurality of symbols from the LDPC coded signal based on the first distribution; and the AFE extracting the third plurality of symbols and the fourth plurality of symbols from at least one additional LDPC coded signal based on the second distribution.

5. The apparatus of claim 1, further comprising:

a metric generator; and wherein:

the LDPC coded signal being received from a communication channel being affected from frequency selective and time-varying narrowband ingress noise;

during a first time, the input receiving the LDPC coded signal including a first plurality of symbols therein being mapped using a first constellation having a first number of constellation points therein;

based on a change of the frequency selective and time-varying narrowband ingress noise affecting the communication channel, during a second time, the input receiving at least one additional LDPC coded signal including a second plurality of symbols therein being mapped using a second constellation having a second number of constellation points therein;

the metric generator calculating a first plurality of metrics corresponding to the first plurality of symbols based on the first constellation; and the metric generator calculating a second plurality of metrics corresponding to the second plurality of symbols based on the second constellation.

6. The apparatus of claim 5, wherein:

the change of the frequency selective and time-varying narrowband ingress noise affecting the communication channel being an increase in the frequency selective and time-varying narrowband ingress noise; and the first number of constellation points being greater in number than the second number of constellation points.

7. The apparatus of claim 1, wherein:

the LDPC coded signal being generated in accordance with a regular LDPC code.

8. The apparatus of claim 1, further comprising:

a bit loading circuitry; and wherein:

the LDPC coded signal being received from a communication channel being affected from frequency selective and time-varying narrowband ingress noise;

during a first time, the input receiving the LDPC coded signal being generated using an LDPC code;

based on a change of the frequency selective and time-varying narrowband ingress noise affecting the communication channel, during a second time, the input receiving the at least one additional LDPC coded signal being generated using at least one additional LDPC code;

the bit loading circuitry directing the LDPC decoder to employ the LDPC matrix for decoding the LDPC coded signal to make an estimate of an information bit encoded therein; and based on the change of the frequency selective and time-varying narrowband ingress noise affecting the communication channel, the bit loading circuitry adaptively directing the LDPC decoder to employ at least one additional LDPC matrix for decoding the at least one additional LDPC coded signal to make an estimate of an information bit encoded therein.

9. The apparatus of claim 1, wherein:

an information block size of the LDPC coded signal is 4600 bits;

the LDPC coded signal having a code rate of 84.8%;

each of the plurality of sub-matrices is a 100×100 square sub-matrix respectively having 100 rows and 100 columns; and the LDPC matrix includes 7 sub-matrix rows and 46 sub-matrix columns.

10. The apparatus of claim 1, wherein:

the apparatus being a communication device; and the communication device being operative within at least one of a satellite communication system, a wireless communication system, a wired communication system, and a fiber-optic communication system.

11. An apparatus, comprising:

an input for receiving an LDPC (Low Density Parity Check) coded signal from a communication channel being affected from frequency selective and time-varying narrowband ingress noise;

an analog front end (AFE) for extracting a plurality of symbols from the LDPC coded signal, the plurality of symbols being modulated within the LDPC coded signal in accordance with orthogonal frequency division multiplexing (OFDM) signaling;

an LDPC decoder for employing an LDPC matrix for decoding the plurality of symbols of the LDPC coded signal to make estimates of information bits encoded therein; and a bit loading circuitry for adaptively directing operations of the AFE and the LDPC decoder based on the frequency selective and time-varying narrowband ingress noise; and wherein:

the LDPC matrix, composed of a plurality of sub-matrices each having a common size, being partitioned into a left hand side matrix and a right hand side matrix;

each sub-matrix within the right hand side matrix being an all zero-valued sub-matrix except those sub-matrices identified in (a) and (b):

(a) each sub-matrix located on a diagonal of the right hand side matrix being a respective one of a first plurality of CSI (Cyclic Shifted Identity) sub-matrices, the diagonal extending from an upper left most sub-matrix of the right hand side matrix to a lower right hand sub-matrix of the of the right hand side matrix; and (b) each sub-matrix being located below the diagonal of the right hand side matrix also being a respective one of a second plurality of CSI sub-matrices.

12. The apparatus of claim 11, wherein:

each sub-matrix within the left hand side matrix being a respective one of a third plurality of CSI sub-matrices; and at least one of the sub-matrices in the left hand side matrix being a CSI sub-matrix having undergone a cyclic shift of zero.

13. The apparatus of claim 11, wherein:

a metric generator; and wherein:

during a first time, the input receiving the LDPC coded signal including the plurality of symbols therein being mapped using a constellation having a number of constellation points therein;

based on a change of the frequency selective and time-varying narrowband ingress noise affecting the communication channel, during a second time, the input receiving at least one additional LDPC coded signal including at least one additional plurality of symbols therein being mapped using at least one additional constellation having at least one additional number of constellation points therein;

the metric generator calculating a plurality of metrics corresponding to the plurality of symbols based on the constellation; and the metric generator calculating at least one additional plurality of metrics corresponding to the at least one additional plurality of symbols based on the at least one additional constellation.

14. The apparatus of claim 11, wherein:

an information block size of the LDPC coded signal is 4600 bits;

the LDPC coded signal having a code rate of 84.8%;

each of the plurality of sub-matrices is a 100 ×100 square sub-matrix respectively having 100 rows and 100 columns; and the LDPC matrix includes 7 sub-matrix rows and 46 sub-matrix columns.

15. The apparatus of claim 11, wherein:

the apparatus being a communication device; and the communication device being operative within at least one of a satellite communication system, a wireless communication system, a wired communication system, and a fiber-optic communication system.

16. A method for operating a communication device, the method comprising:

receiving an LDPC (Low Density Parity Check) coded signal; and operating an LDPC decoder, within the communication device, for employing an LDPC matrix for decoding the LDPC coded signal to make an estimate of an information bit encoded therein; and wherein:

the LDPC matrix, composed of a plurality of sub-matrices each having a common size, being partitioned into a left hand side matrix and a right hand side matrix; and each sub-matrix within the right hand side matrix being an all zero-valued sub-matrix except those sub-matrices identified in (a) and (b):

(a) each sub-matrix located on a diagonal of the right hand side matrix being a respective one of a first plurality of CSI (Cyclic Shifted Identity) sub-matrices, the diagonal extending from an upper left most sub-matrix of the right hand side matrix to a lower right hand sub-matrix of the of the right hand side matrix; and (b) each sub-matrix being located below the diagonal of the right hand side matrix also being a respective one of a second plurality of CSI sub-matrices.

17. The method of claim 16, wherein:

each sub-matrix within the left hand side matrix being a respective one of a third plurality of CSI sub-matrices; and at least one of the sub-matrices in the left hand side matrix being a CSI sub-matrix having undergone a cyclic shift of zero.

18. The method of claim 16, further comprising:

receiving the LDPC coded signal from a communication channel being affected from frequency selective and time-varying narrowband ingress noise;

based on the frequency selective and time-varying narrowband ingress noise, adaptively directing operation of the LDPC decoder, the LDPC decoder being operative within a plurality of operational modes.

19. The method of claim 16, wherein:

an information block size of the LDPC coded signal is 4600 bits;

the LDPC coded signal having a code rate of 84.8%;

each of the plurality of sub-matrices is a 100×100 square sub-matrix respectively having 100 rows and 100 columns; and the LDPC matrix includes 7 sub-matrix rows and 46 sub-matrix columns.

20. The method of claim 16, wherein:

the method being performed within a communication device; and the communication device being operative within at least one of a satellite communication system, a wireless communication system, a wired communication system, and a fiber-optic communication system.

* * * * *

UNITED STATES PATENT AND TRADEMARK OFFICE
CERTIFICATE OF CORRECTION

PATENT NO.        : 8,407,555 B2            Page 1 of 1
APPLICATION NO.   : 12/748547
DATED             : March 26, 2013
INVENTOR(S)       : Ba-Zhong Shen et al.

It is certified that error appears in the above-identified patent and that said Letters Patent is hereby corrected as shown below:

In the Claims
Col. 20, line 59, in claim 4: after "such that" insert --the--
Col. 21, line 4, in claim 5: after "such that" insert --the--
Col. 22, line 47, in claim 11: after "of the" delete "of the"

Signed and Sealed this
Eleventh Day of March, 2014

Michelle K. Lee
*Deputy Director of the United States Patent and Trademark Office*